United States Patent
Matsuura

(10) Patent No.: US 10,290,729 B2
(45) Date of Patent: May 14, 2019

(54) NARROW ACTIVE CELL IE TYPE TRENCH GATE IGBT AND A METHOD FOR MANUFACTURING A NARROW ACTIVE CELL IE TYPE TRENCH GATE IGBT

(71) Applicant: RENESAS ELECTRONICS CORPORATION, Tokyo (JP)

(72) Inventor: Hitoshi Matsuura, Kanagawa (JP)

(73) Assignee: Renesas Electronics Corporation, Tokyo (JP)

(*) Notice: Subject to any disclaimer, the term of this patent is extended or adjusted under 35 U.S.C. 154(b) by 0 days.

(21) Appl. No.: 15/807,975

(22) Filed: Nov. 9, 2017

(65) Prior Publication Data
US 2018/0069108 A1     Mar. 8, 2018

Related U.S. Application Data

(62) Division of application No. 13/903,068, filed on May 28, 2013, now abandoned.

(30) Foreign Application Priority Data

Jun. 11, 2012 (JP) .................. 2012-131915

(51) Int. Cl.
*H01L 29/739* (2006.01)
*H01L 29/66* (2006.01)
(Continued)

(52) U.S. Cl.
CPC ...... *H01L 29/7397* (2013.01); *H01L 29/0619* (2013.01); *H01L 29/0696* (2013.01);
(Continued)

(58) Field of Classification Search
CPC ............ H01L 29/7397; H01L 29/0619; H01L 29/0696; H01L 29/0834; H01L 29/1095; H01L 29/407; H01L 29/66348
(Continued)

(56) References Cited

U.S. PATENT DOCUMENTS 6,818,945 B2   11/2004  Kawaguchi et al.
6,891,224 B2    5/2005  Ogura et al.
(Continued)

FOREIGN PATENT DOCUMENTS

EP   2 613 356      7/2013
JP   11-345969     12/1999
(Continued)

OTHER PUBLICATIONS

Japanese Office Action received in corresponding Japanese Application No. 2016-145987 dated Jun. 6, 2017.
(Continued)

*Primary Examiner* — Matthew C Landau
*Assistant Examiner* — Mark Hatzilambrou
(74) *Attorney, Agent, or Firm* — Mattingly & Malur, PC

(57) ABSTRACT

In an equal width active cell IE type IGBT, a wide active cell IE type IGBT, and the like, an active cell region is equal in trench width to an inactive cell region, or the trench width of the inactive cell region is narrower. Accordingly, it is relatively easy to ensure the breakdown voltage. However, with such a structure, an attempt to enhance the IE effect entails problems such as further complication of the structure. The present invention provides a narrow active cell IE type IGBT having an active cell two-dimensional thinned-out structure, and not having a substrate trench for contact.

20 Claims, 32 Drawing Sheets

(51) Int. Cl.
  *H01L 29/06* (2006.01)
  *H01L 29/10* (2006.01)
  *H01L 29/08* (2006.01)
  *H01L 29/40* (2006.01)

(52) U.S. Cl.
  CPC ...... *H01L 29/0834* (2013.01); *H01L 29/1095* (2013.01); *H01L 29/407* (2013.01); *H01L 29/66348* (2013.01)

(58) Field of Classification Search
  USPC .................................................. 257/328
  See application file for complete search history.

(56) References Cited

U.S. PATENT DOCUMENTS

| | | | |
|---|---|---|---|
| 7,456,487 | B2 | 11/2008 | Ogura et al. |
| 2001/0040255 | A1 | 11/2001 | Tanaka |
| 2003/0102486 | A1* | 6/2003 | Inoue ................ H01L 29/66348 257/139 |
| 2004/0041171 | A1 | 3/2004 | Ogura et al. |
| 2006/0273351 | A1 | 12/2006 | Ozoe et al. |
| 2008/0035992 | A1 | 2/2008 | Kawaguchi et al. |
| 2008/0203535 | A1 | 8/2008 | Noda et al. |
| 2009/0039386 | A1 | 2/2009 | Ogura et al. |
| 2009/0283797 | A1 | 11/2009 | Takahashi et al. |
| 2010/0308401 | A1 | 12/2010 | Narazaki |
| 2011/0233684 | A1 | 9/2011 | Matsushita |
| 2013/0037853 | A1* | 2/2013 | Onozawa ............ H01L 29/0661 257/139 |

FOREIGN PATENT DOCUMENTS

| | | |
|---|---|---|
| JP | 2001-308328 | 11/2001 |
| JP | 2001-326353 | 11/2001 |
| JP | 2004-22941 | 1/2004 |
| JP | 2004-241413 | 8/2004 |
| JP | 2005-294649 | 10/2005 |
| JP | 2005-340626 | 12/2005 |
| JP | 2008-66708 | 3/2008 |
| JP | 2009-43782 | 2/2009 |
| JP | 2009-188290 | 8/2009 |
| JP | 2011-176249 | 9/2011 |

OTHER PUBLICATIONS

Chinese Office Action received in corresponding Chinese Application No. 201310240332.2 dated Mar. 3, 2017.
Extended European Search Report received in corresponding European Application No. 13168689.1 dated Dec. 5, 2016.
Japanese Office Action received in corresponding Japanese Application No. 2012-131915 dated Apr. 28, 2016.

* cited by examiner

NARROW ACTIVE CELL IE TYPE TRENCH GATE IGBT AND A METHOD FOR MANUFACTURING A NARROW ACTIVE CELL IE TYPE TRENCH GATE IGBT

CROSS-REFERENCE TO RELATED APPLICATIONS

The disclosure of Japanese Patent Application No. 2012-131915 filed on Jun. 11, 2012 including the specification, drawings and abstract is incorporated herein by reference in its entirety.

BACKGROUND

The present invention relates to a semiconductor device (or a semiconductor integrated circuit device), and a method for manufacturing a semiconductor device (or a semiconductor integrated circuit device). More particularly, it relates to a technology effectively applicable to an IGBT device technology and a method for manufacturing an IGBT.

Japanese Unexamined Patent Publication No. Hei 11 (1999)-345969 (Patent Document 1) relates to an equal-width active cell IE (Injection Enhance) type IGBT (Integrated Gate Bipolar Transistor) having equidistant trenches. This document discloses therein a device structure in which an N+ type emitter region is finely divided along the longitudinal direction by P+ body contact regions (so-called "active cell two-dimensional thinned-out structure").

Japanese Unexamined Patent Publication No. 2005-294649 (Patent Document 2) relates to a wide active cell IE type IGBT in which the trench interval in an active cell region is larger than the trench interval in an inactive cell region. This document discloses therein a technology of arranging a floating P type region extending to the trench bottom ends on the opposite sides under the inactive cell region. Incidentally, in this document, after trench formation, the floating P type region is introduced simultaneously with the P type body region.

Patent Documents

[Patent Document 1] Japanese Unexamined Patent Publication No. Hei 11 (1999)-345969

[Patent Document 2] Japanese Unexamined Patent Publication No. 2005-294649

SUMMARY

In an equal-width active cell IE type IGBT, a wide active cell IE type IGBT, or the like, the trench widths in an active cell region and an inactive cell region are equal to each other, or the trench width in the inactive cell region is narrower. For this reason, it is possible to ensure the breakdown voltage relatively easily. However, with such a structure, an attempt to enhance the IE effect unfavorably further complicates the structure, and causes other problems.

Means and the like for solving such a problem will be described below. Other problems and novel features will be apparent from the description of this specification and the accompanying drawings.

Summaries of the representative ones of the inventions disclosed in the present invention will be described in brief as follows.

Namely, the summary of one embodiment of the present invention is a narrow active cell IE type IGBT which has an active cell two-dimensional thinned-out structure, and in which there is not arranged a body contact region in a cross section orthogonal to the substrate surface, passing through the emitter region, and orthogonal to the trenches on the opposite sides.

The effects obtainable by representative ones of the embodiments disclosed in the present invention will be described in brief as follows.

Namely, in accordance with one embodiment of the present invention, the IE effect can be enhanced while avoiding excessive complication of the device structure.

Figure 1:
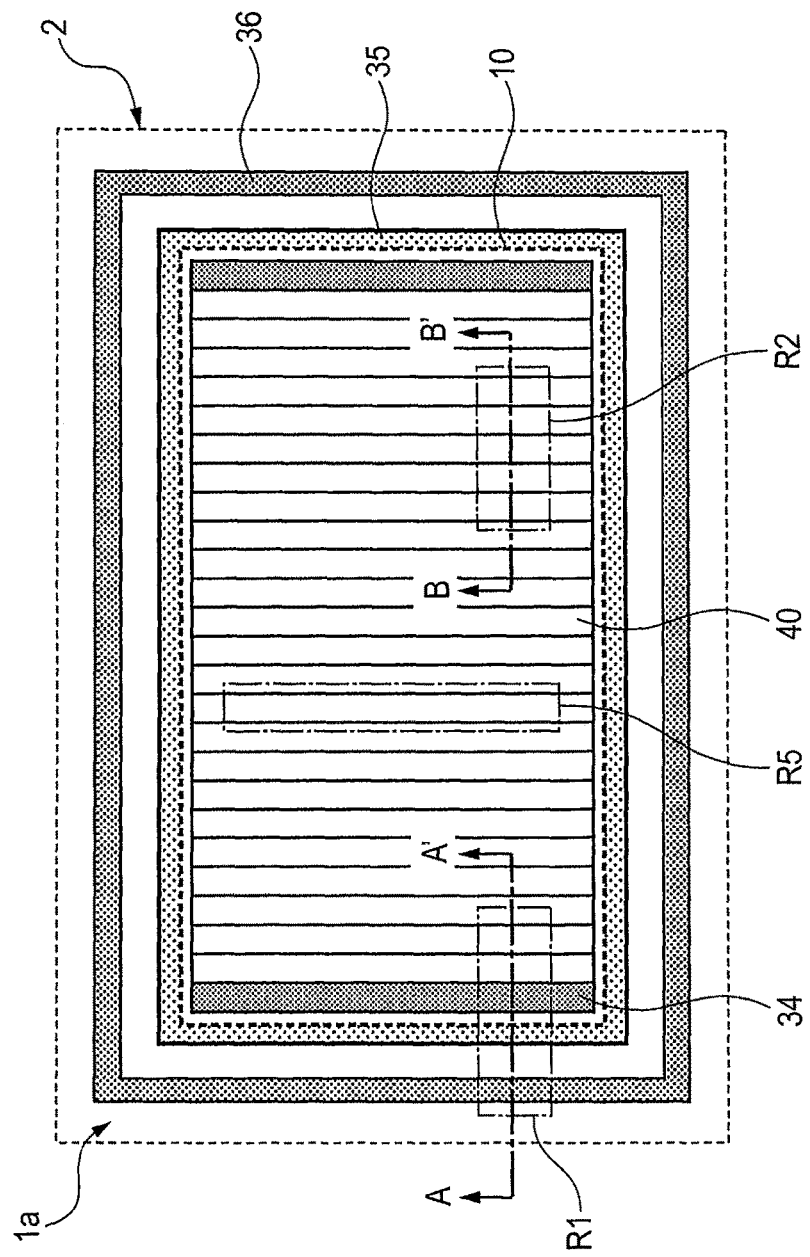
FIG. 1 is a top schematic layout view of a cell region and its periphery of a narrow active cell IE type trench gate IGBT device chip for illustrating the outline of the device structure in a narrow active cell IE type trench gate IGBT of main embodiments (including modified examples) of the present invention.
Figure 2:
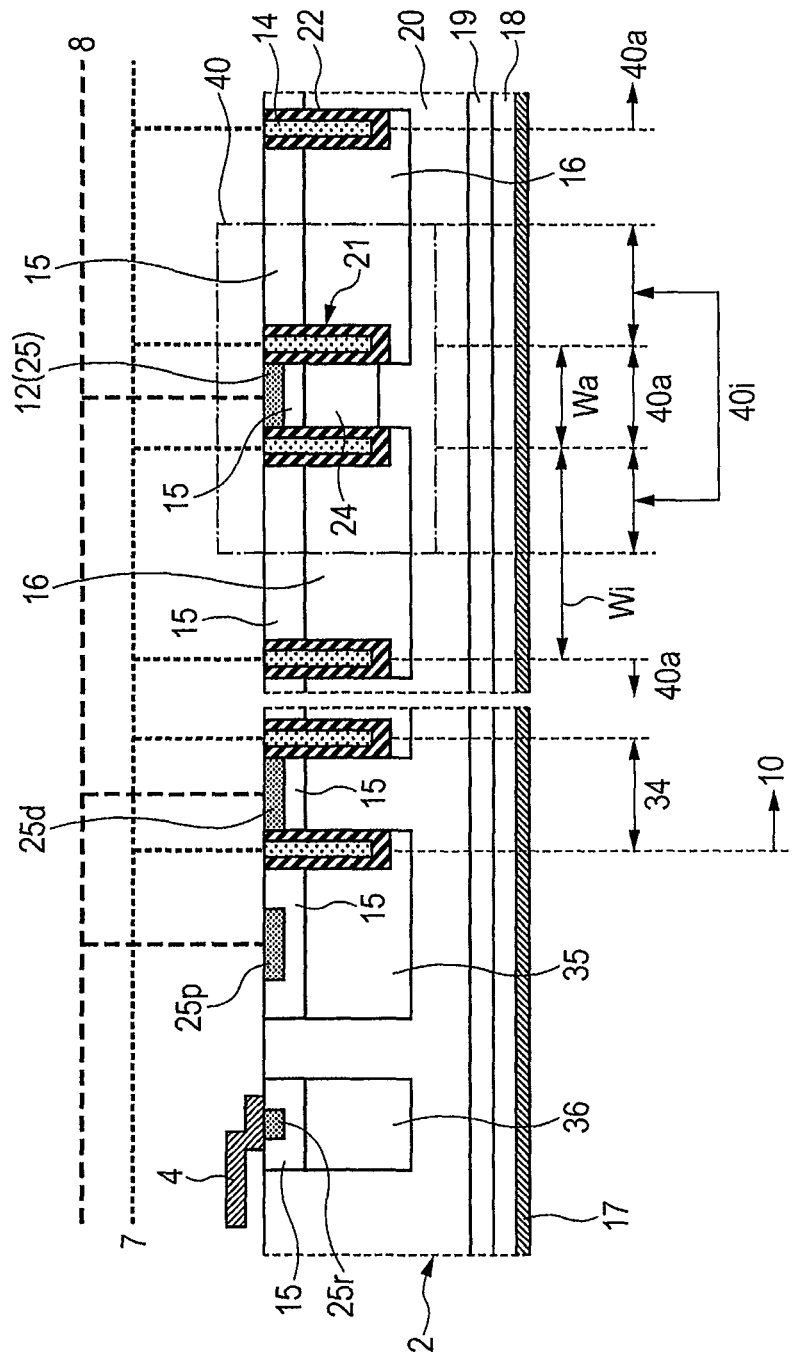
FIG. 2 is a device schematic cross-sectional view corresponding to an A-A' cross section of a cell region end cut-out region R1 of FIG. 1.
Figure 6:
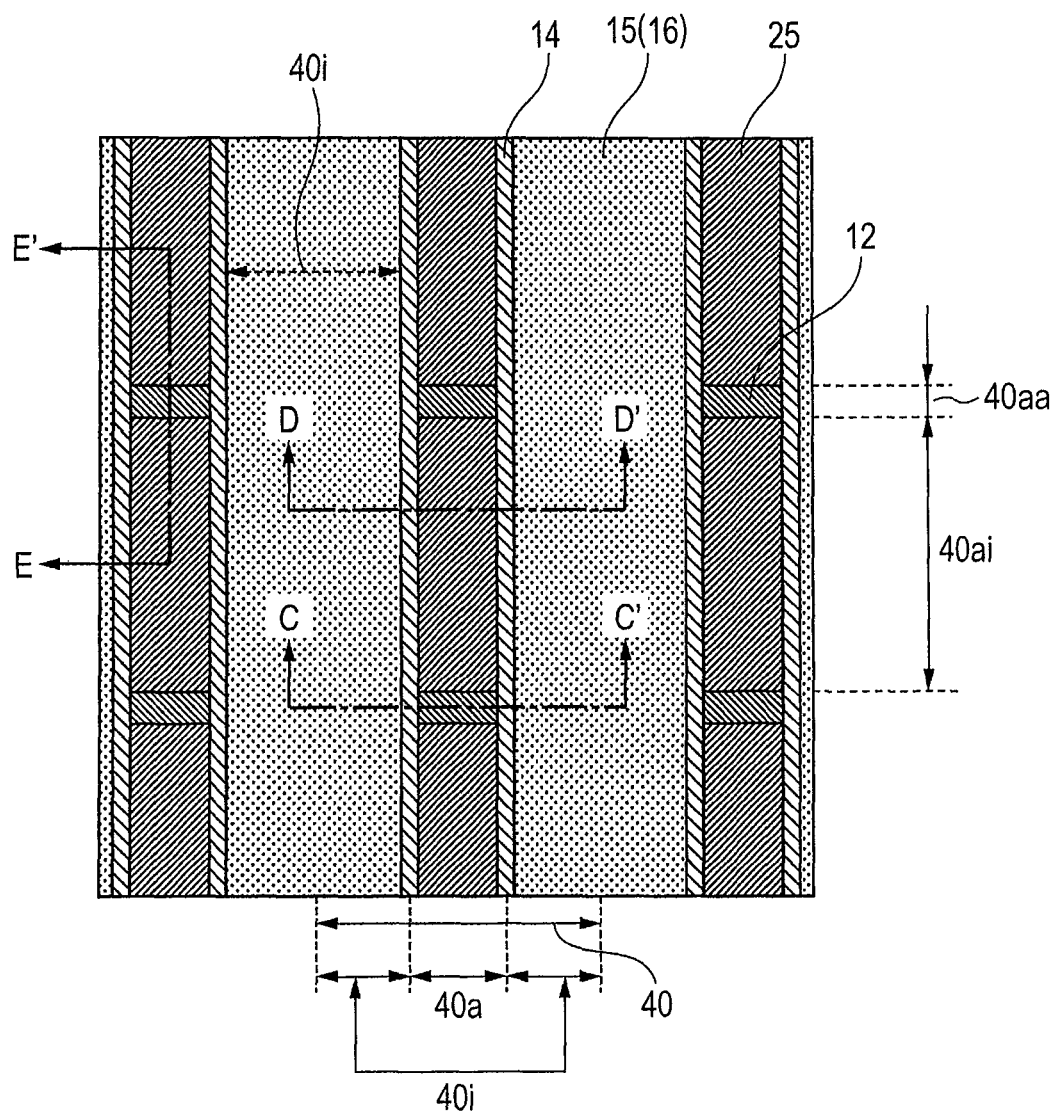
FIG. 6 is an enlarged top view of a portion corresponding to the cell region internal cut-out region R3 of FIG. 5 for illustrating the device structure of the one embodiment (an active section dispersed structure in an active cell two-dimensional thinned-out structure) of the present invention.
Figure 7:
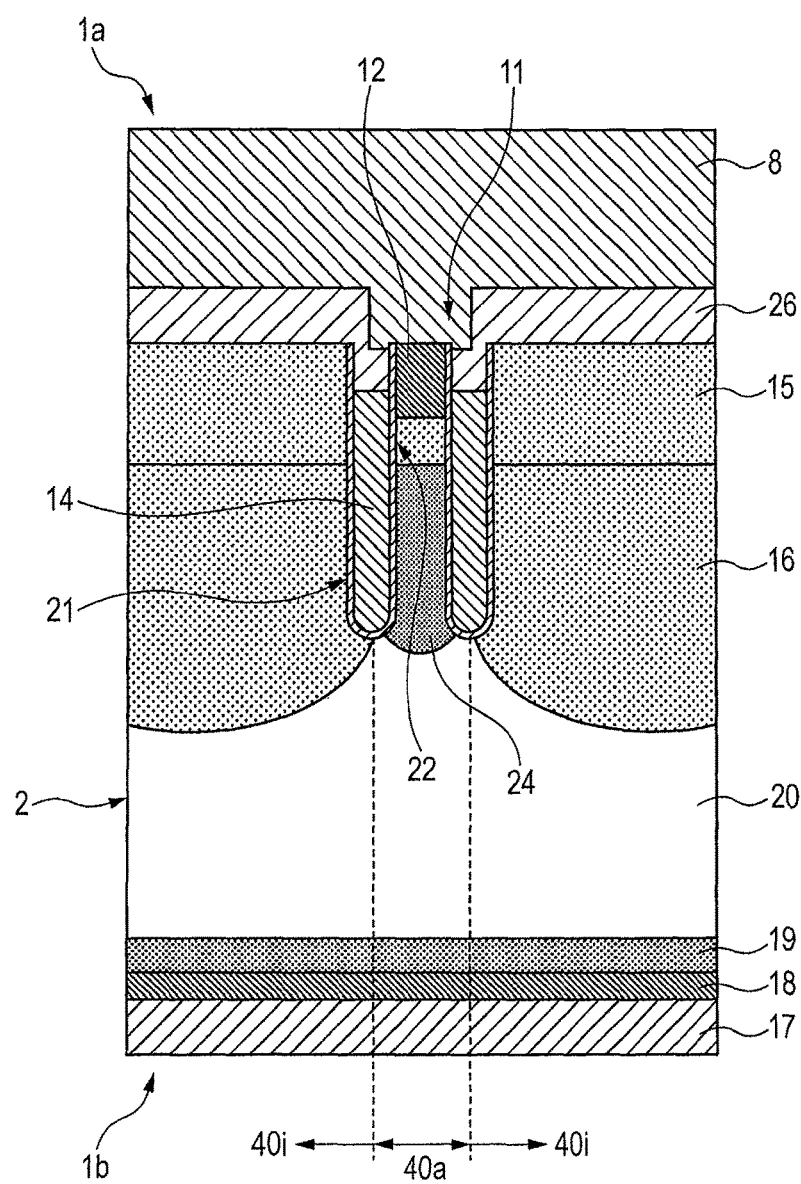
FIG. 7 is a device cross-sectional view corresponding to a C-C' cross section of FIG. 6.
Figure 8:
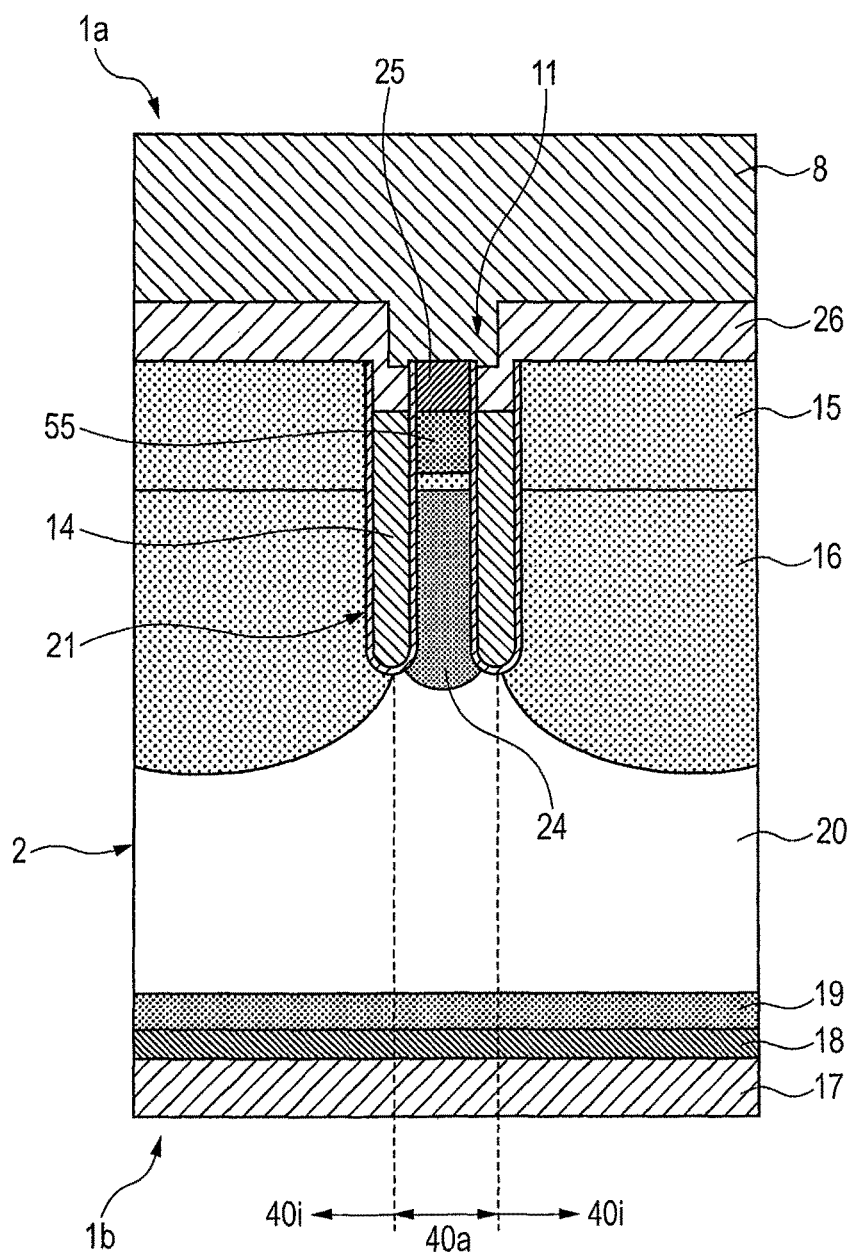
FIG. 8 is a device cross-sectional view corresponding to a D-D' cross section of FIG. 6.
Figure 15:
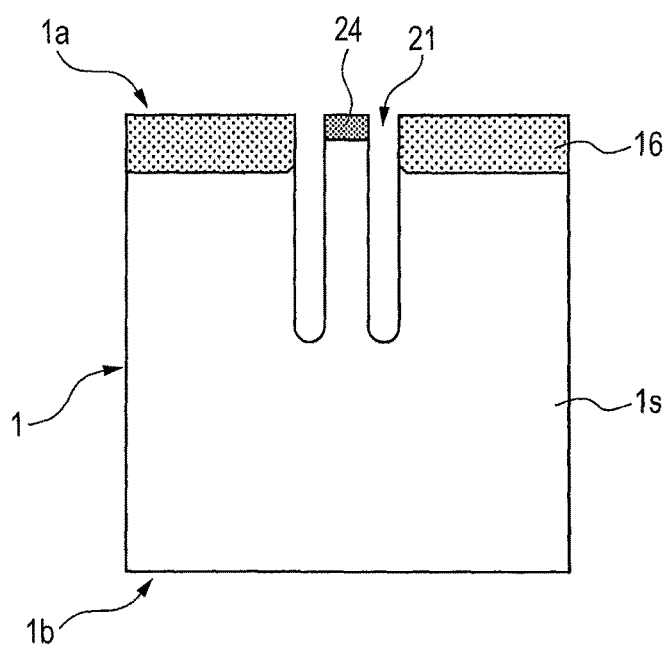
Figure 16:
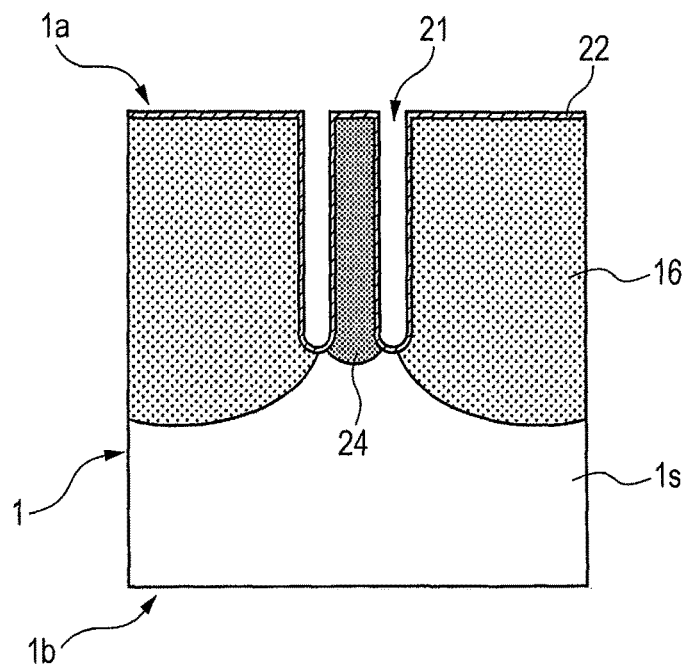
Figure 17:
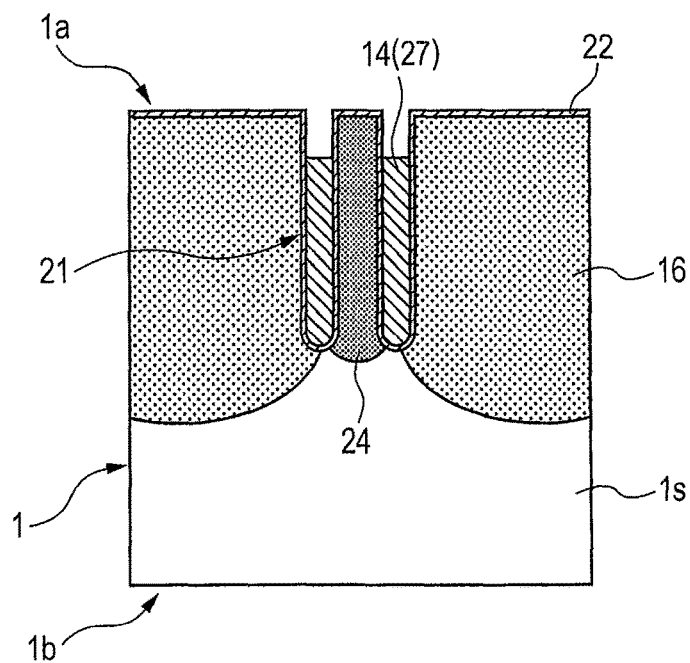
Figure 18:
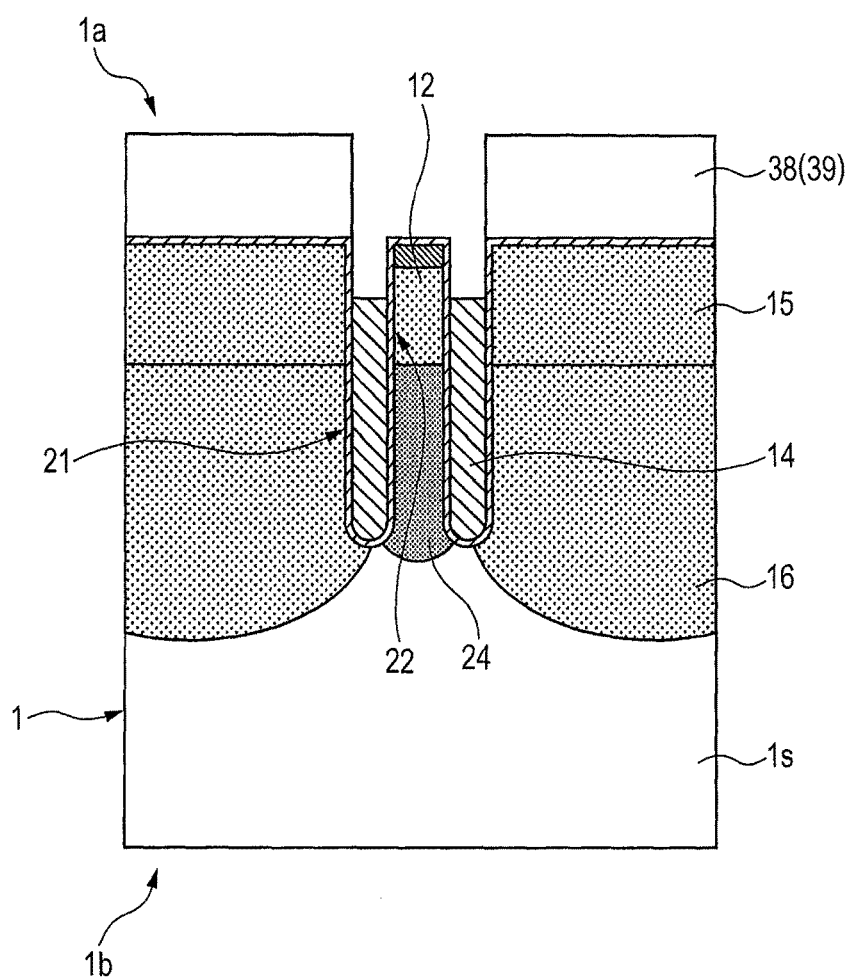
Figure 19:
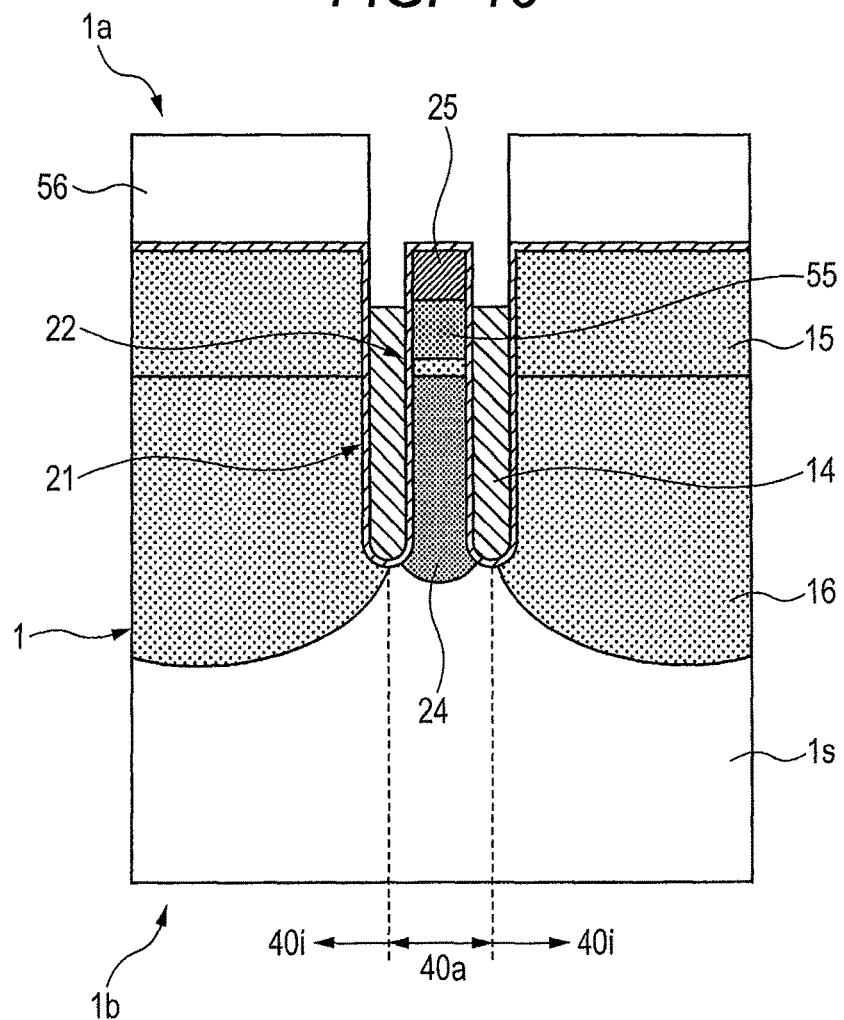
Figure 20:
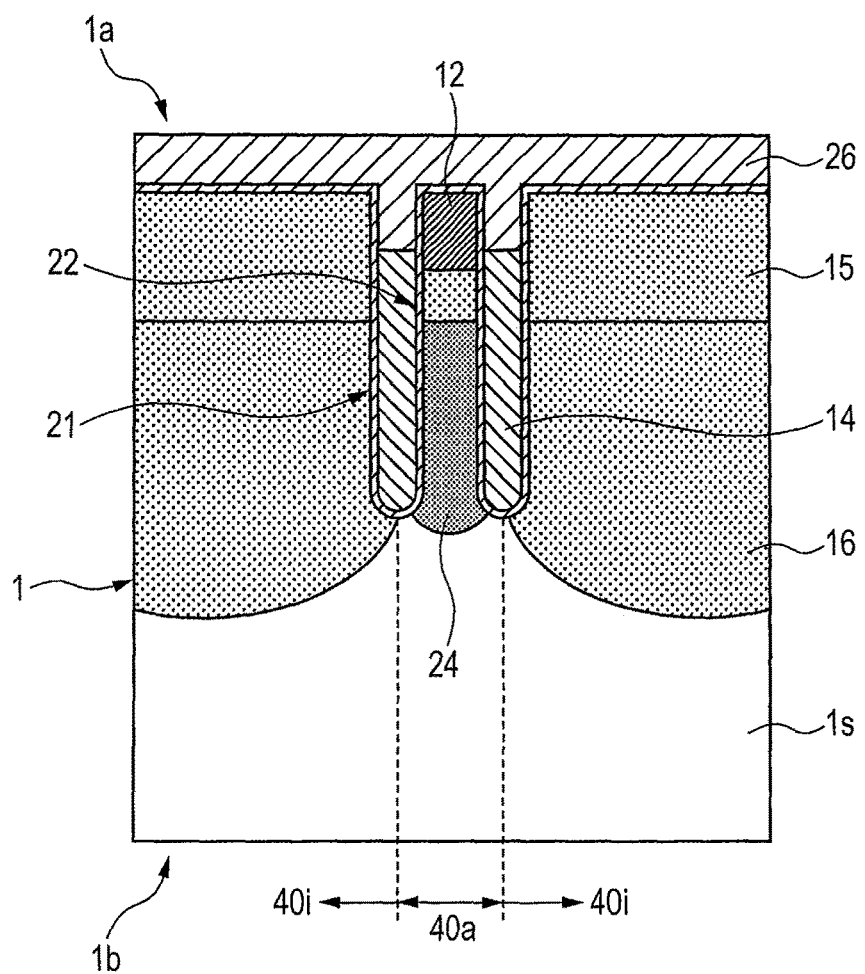
Figure 21:
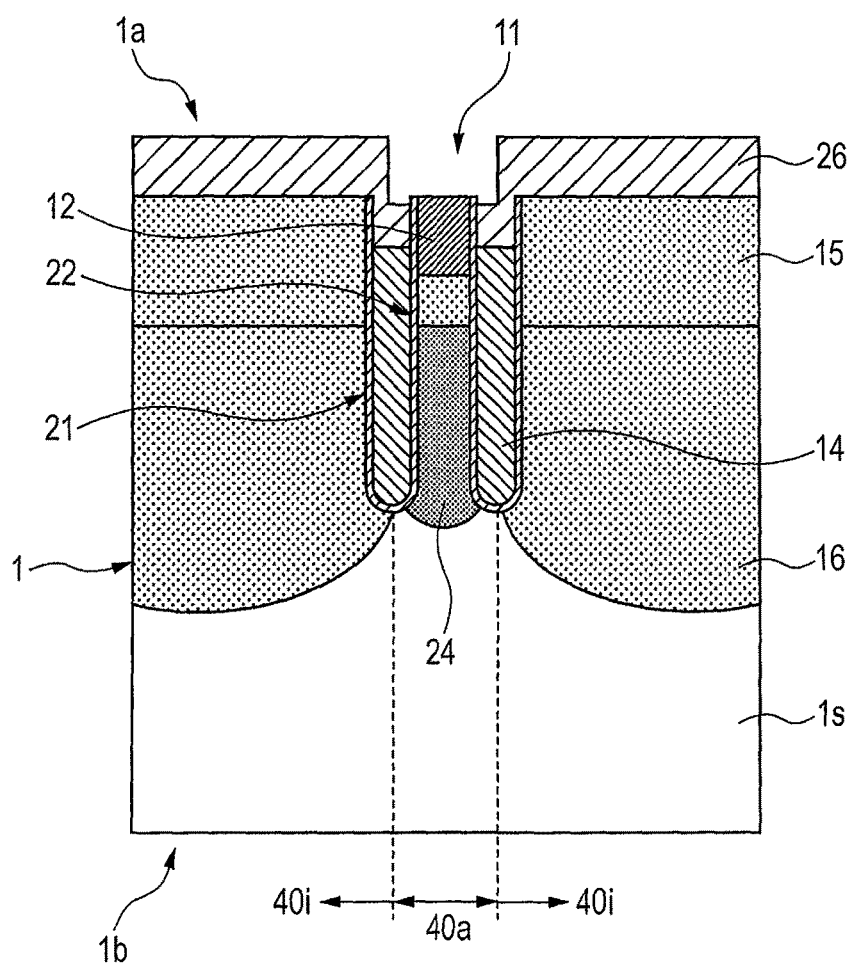
Figure 22:
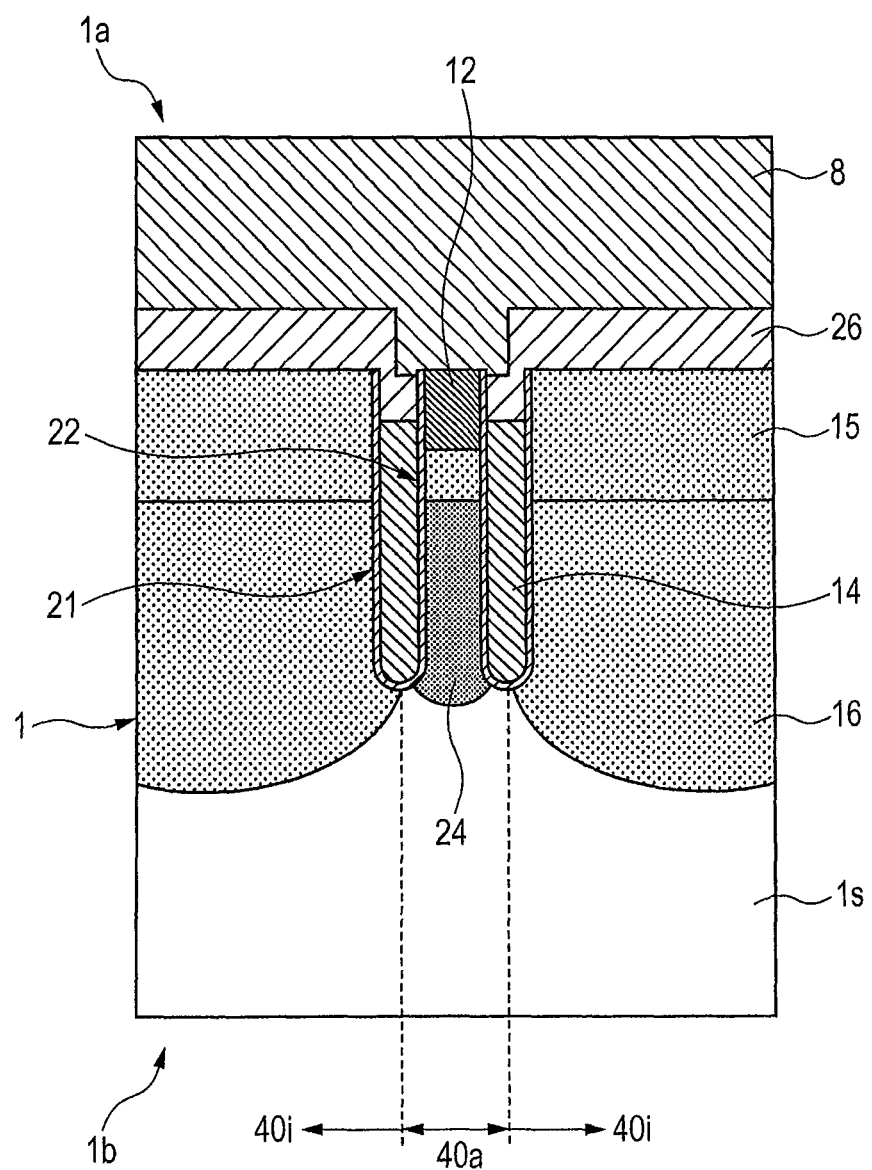
Figure 23:
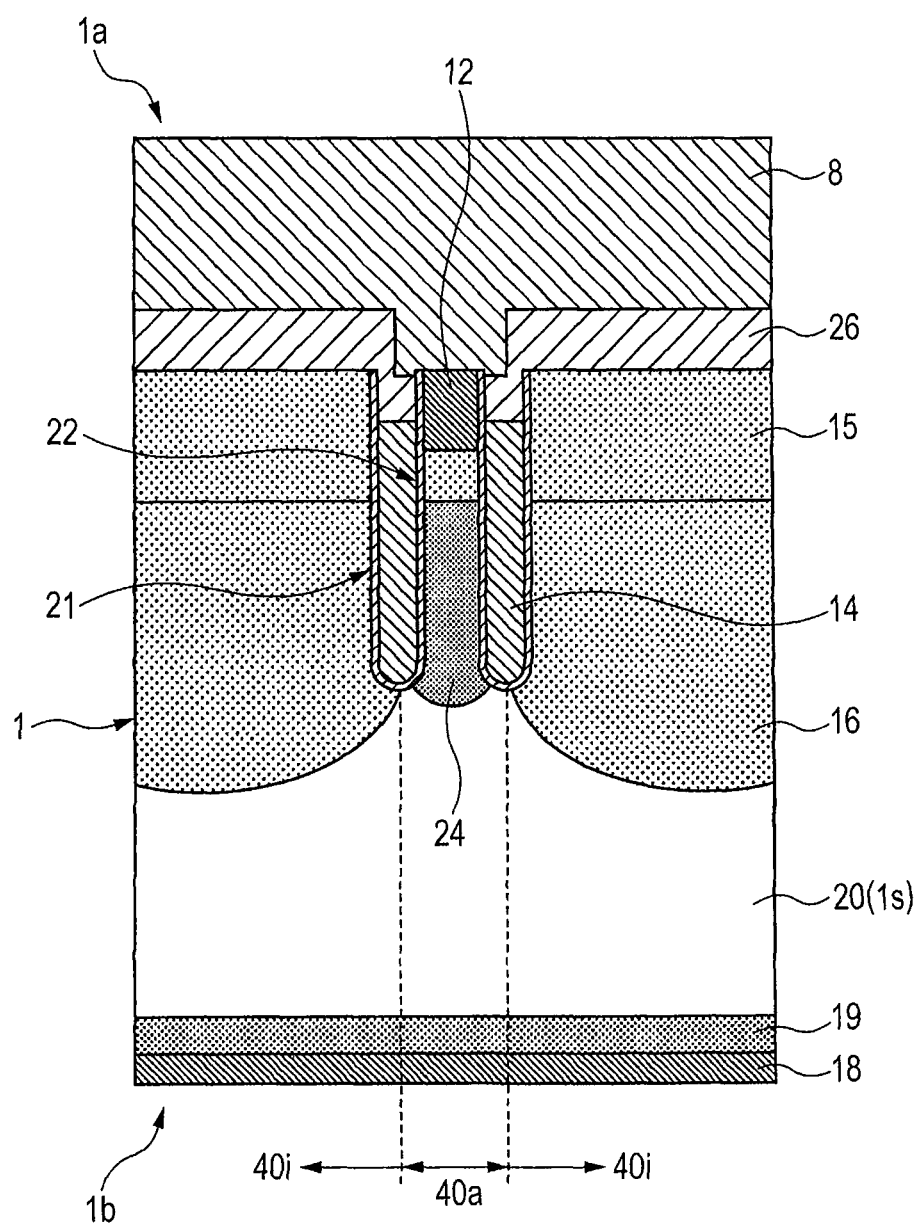
Figure 24:
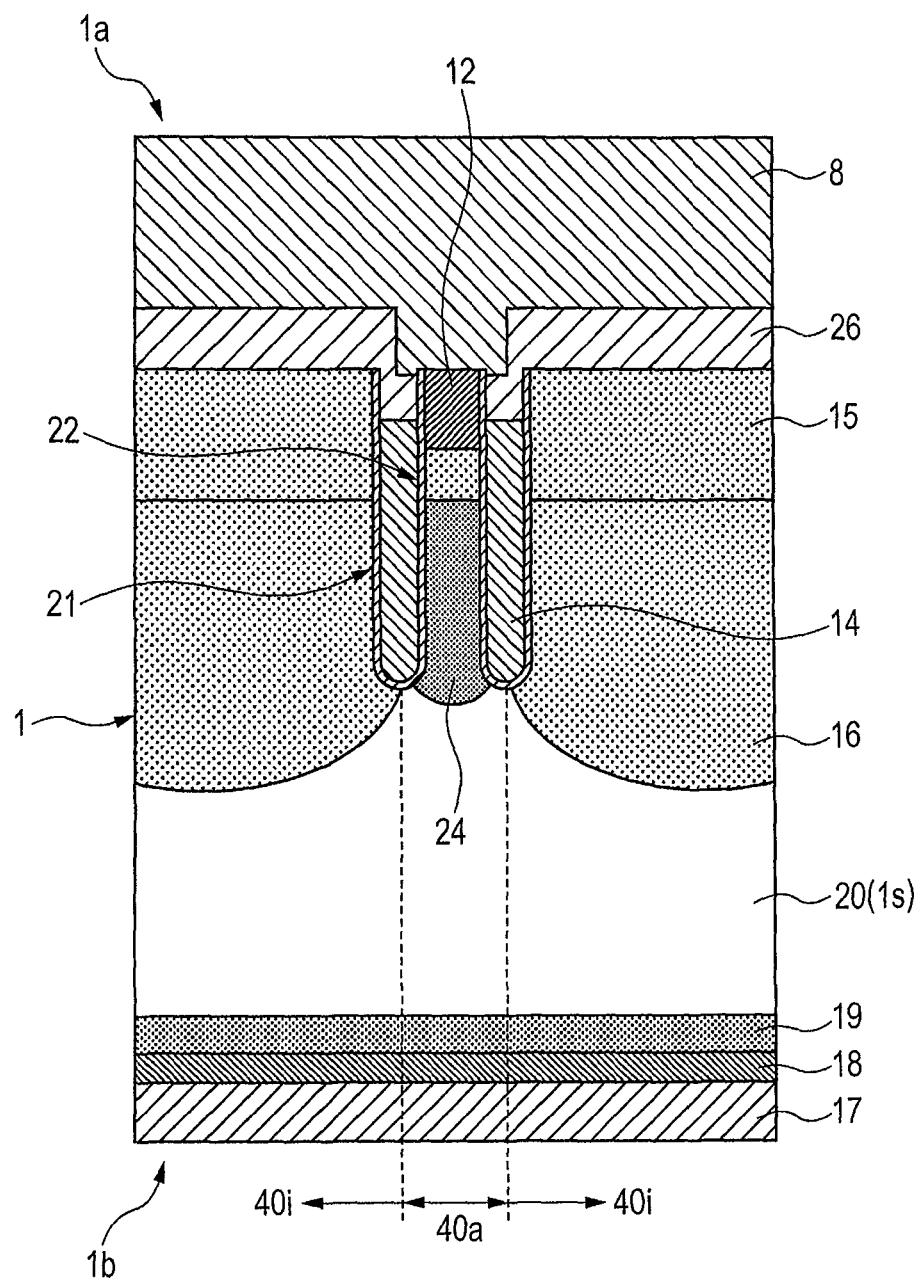
Figure 25:
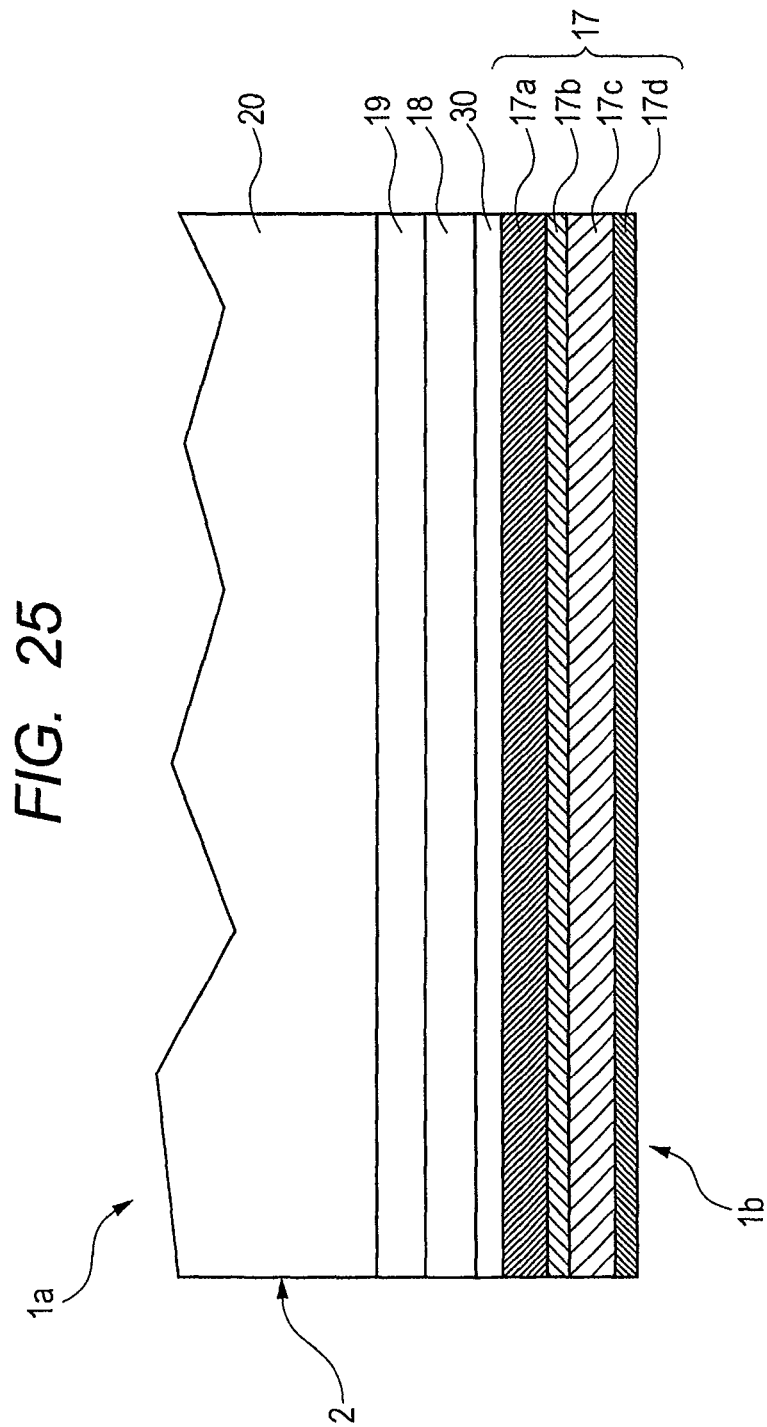
Figure 26:
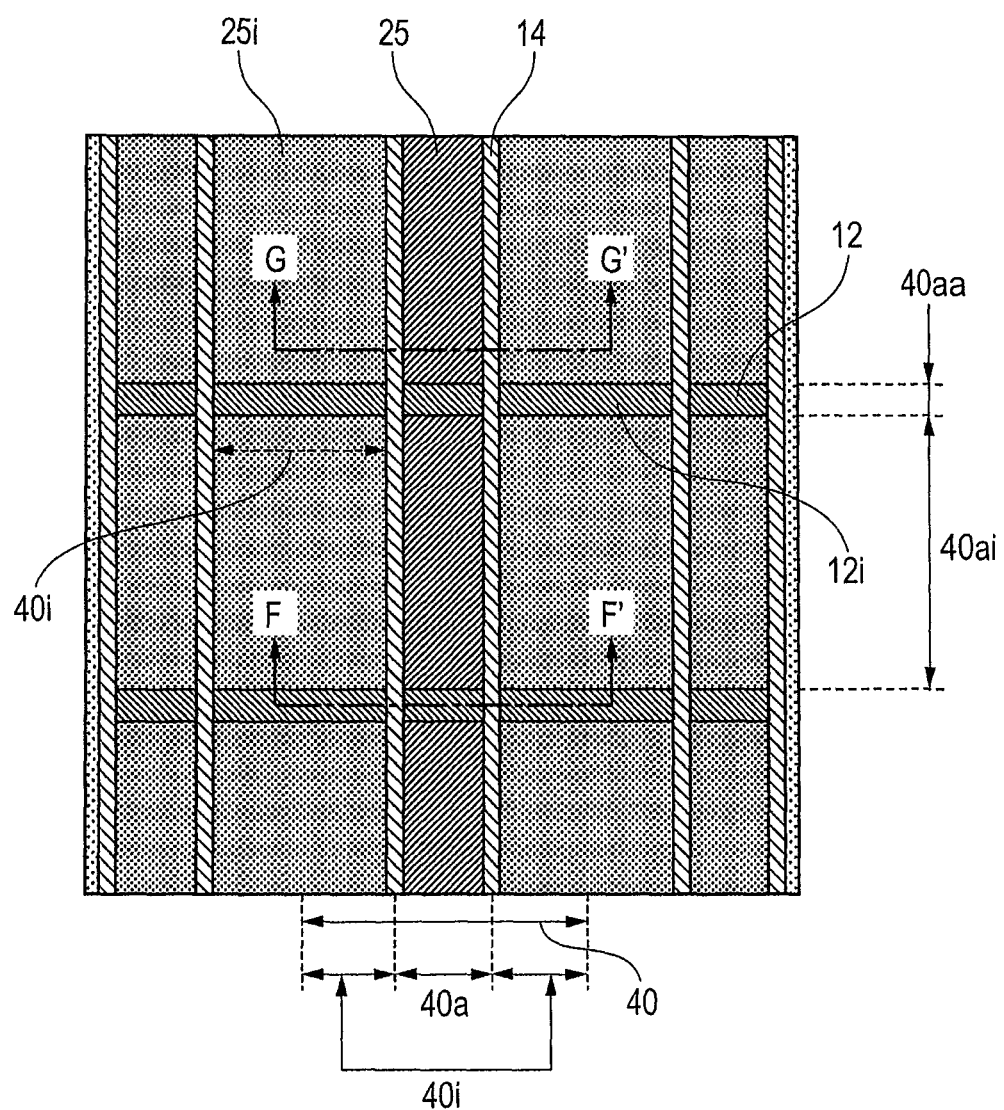
Figure 27:
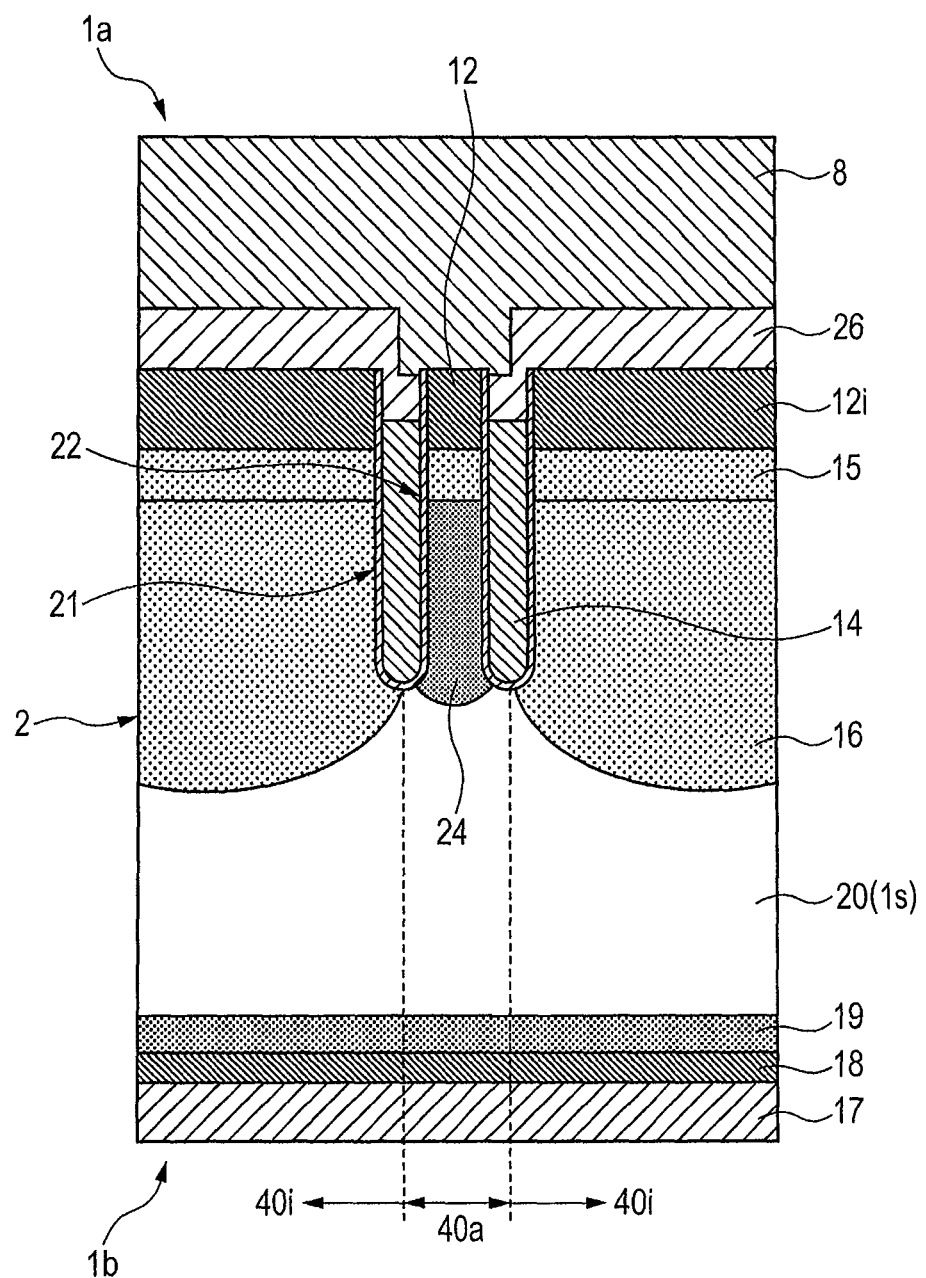
Figure 28:
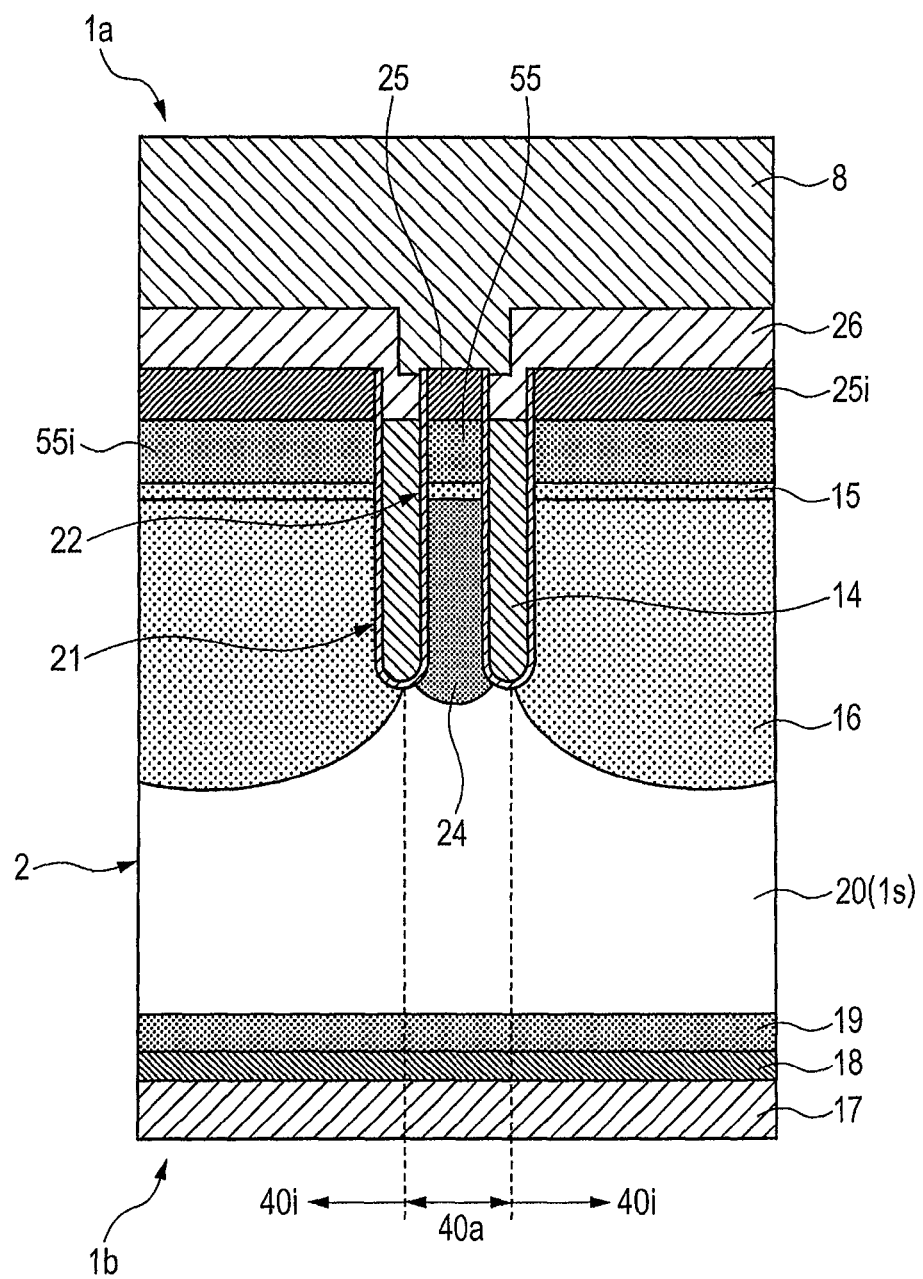
Figure 29:
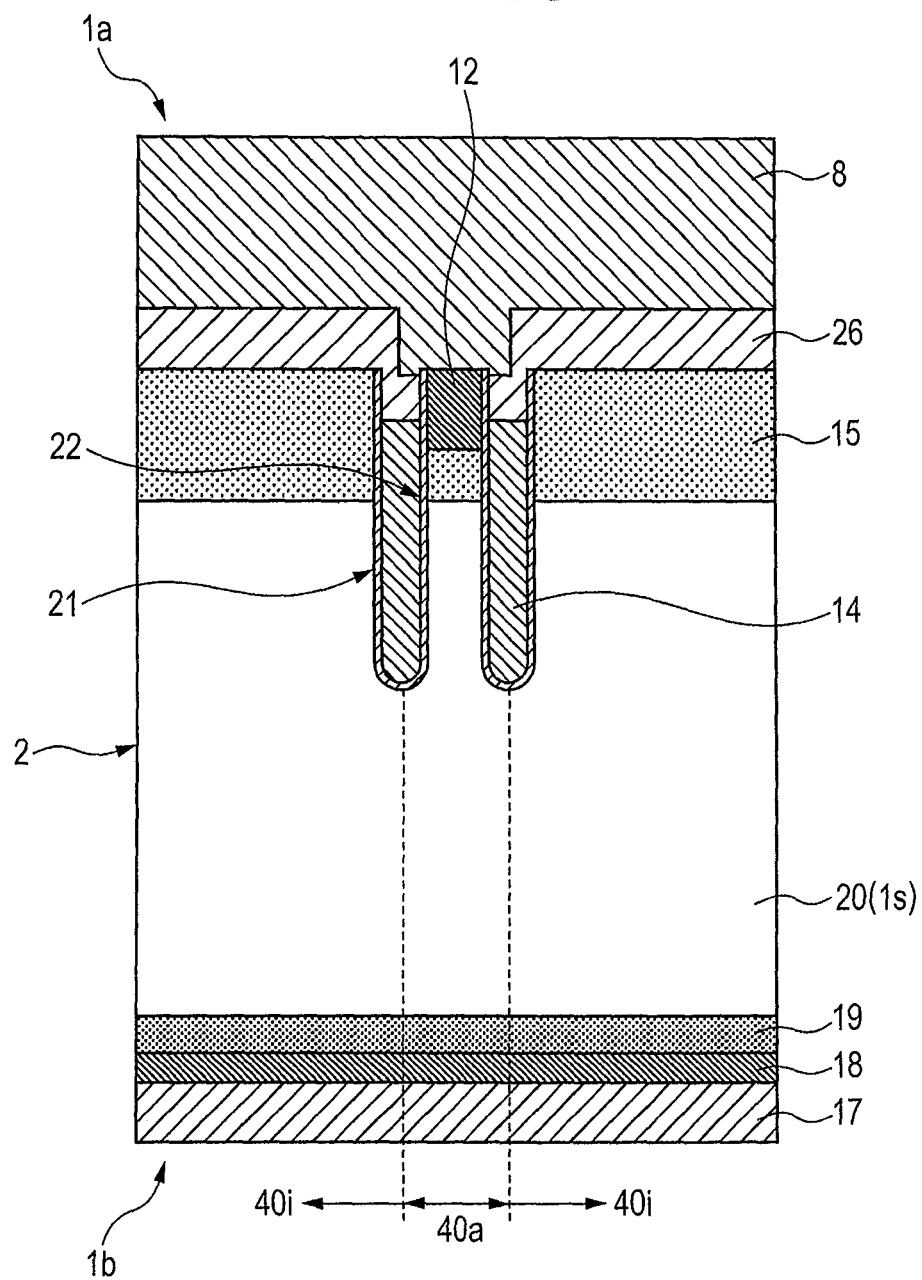
Figure 30:
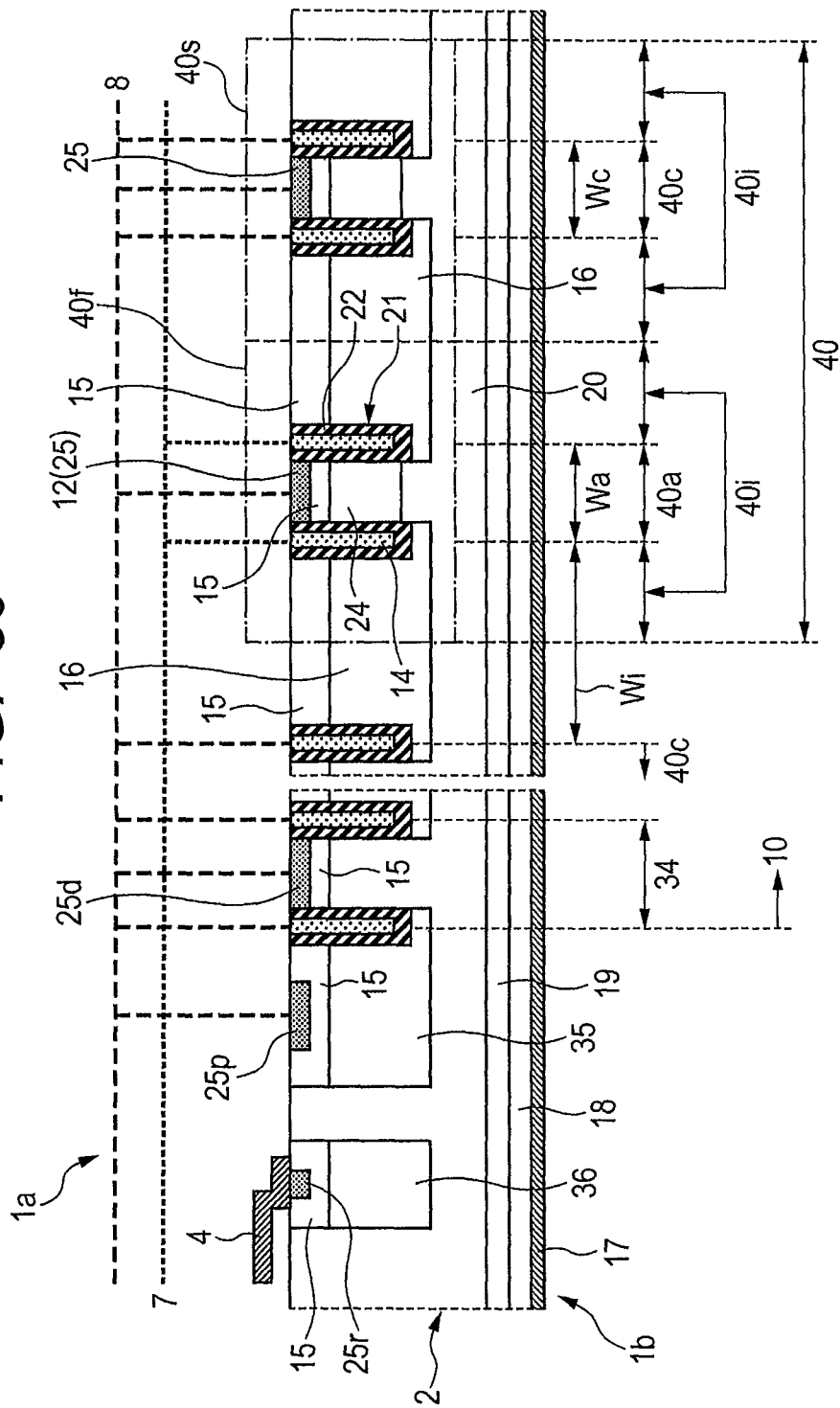
Figure 31:
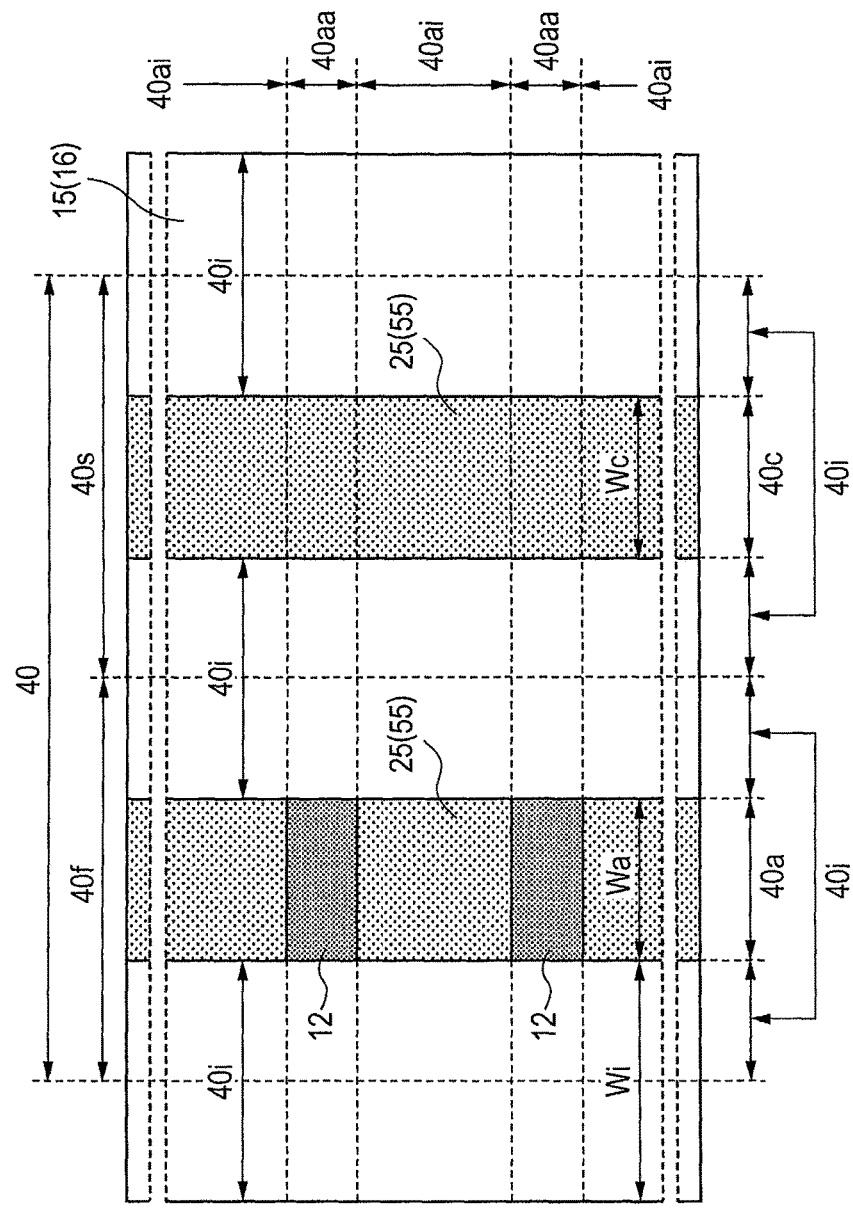
Figure 32:
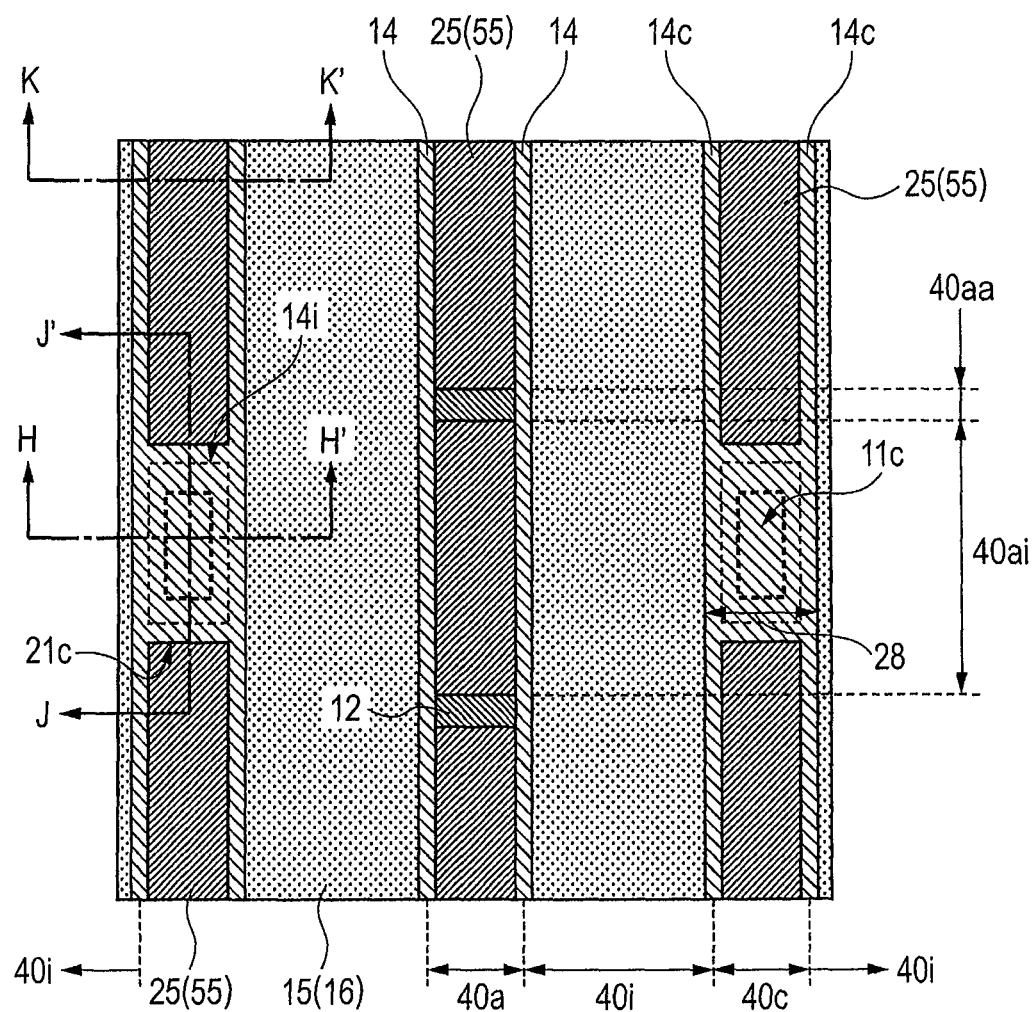
Figure 33:
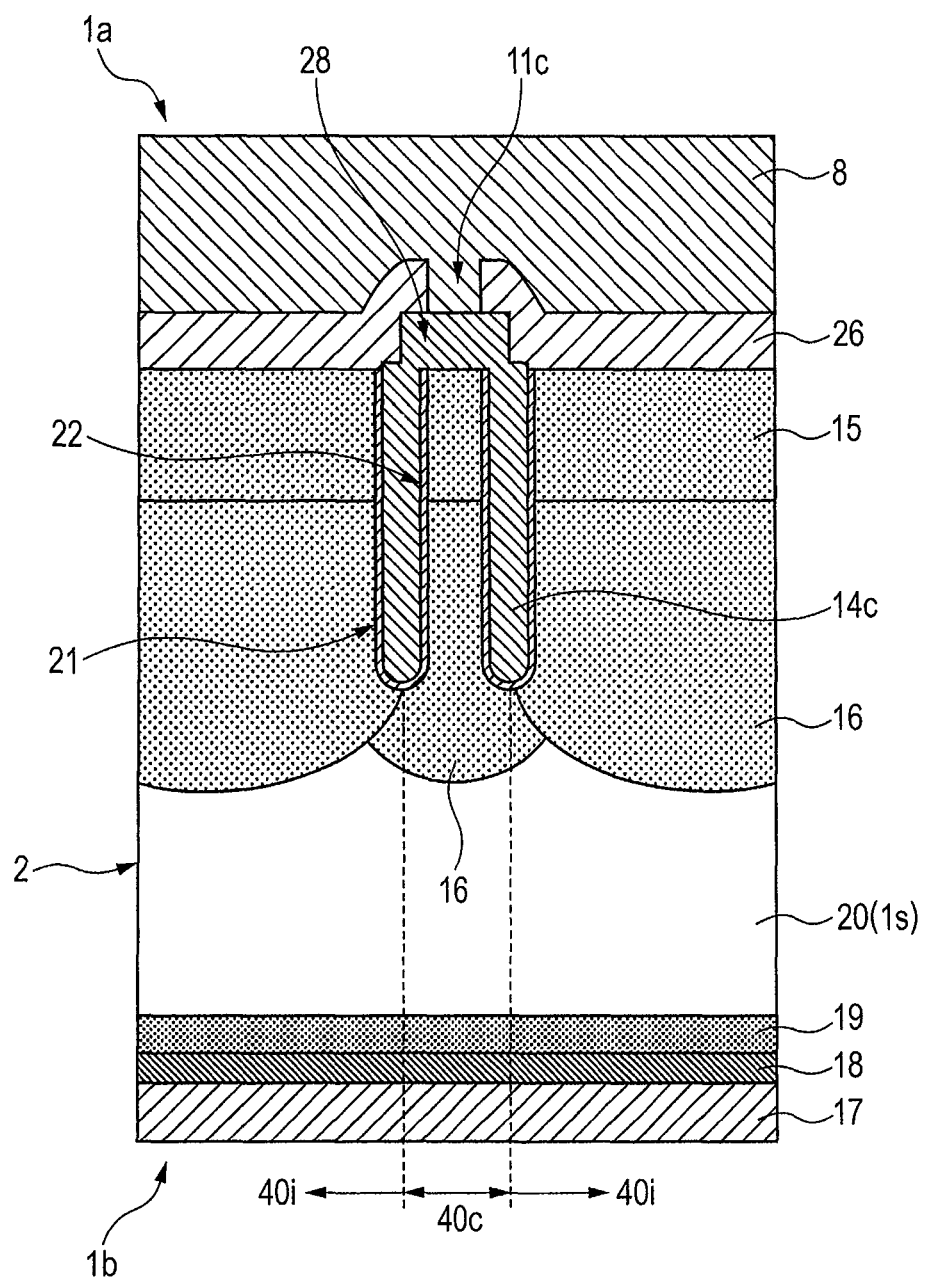
Figure 34:
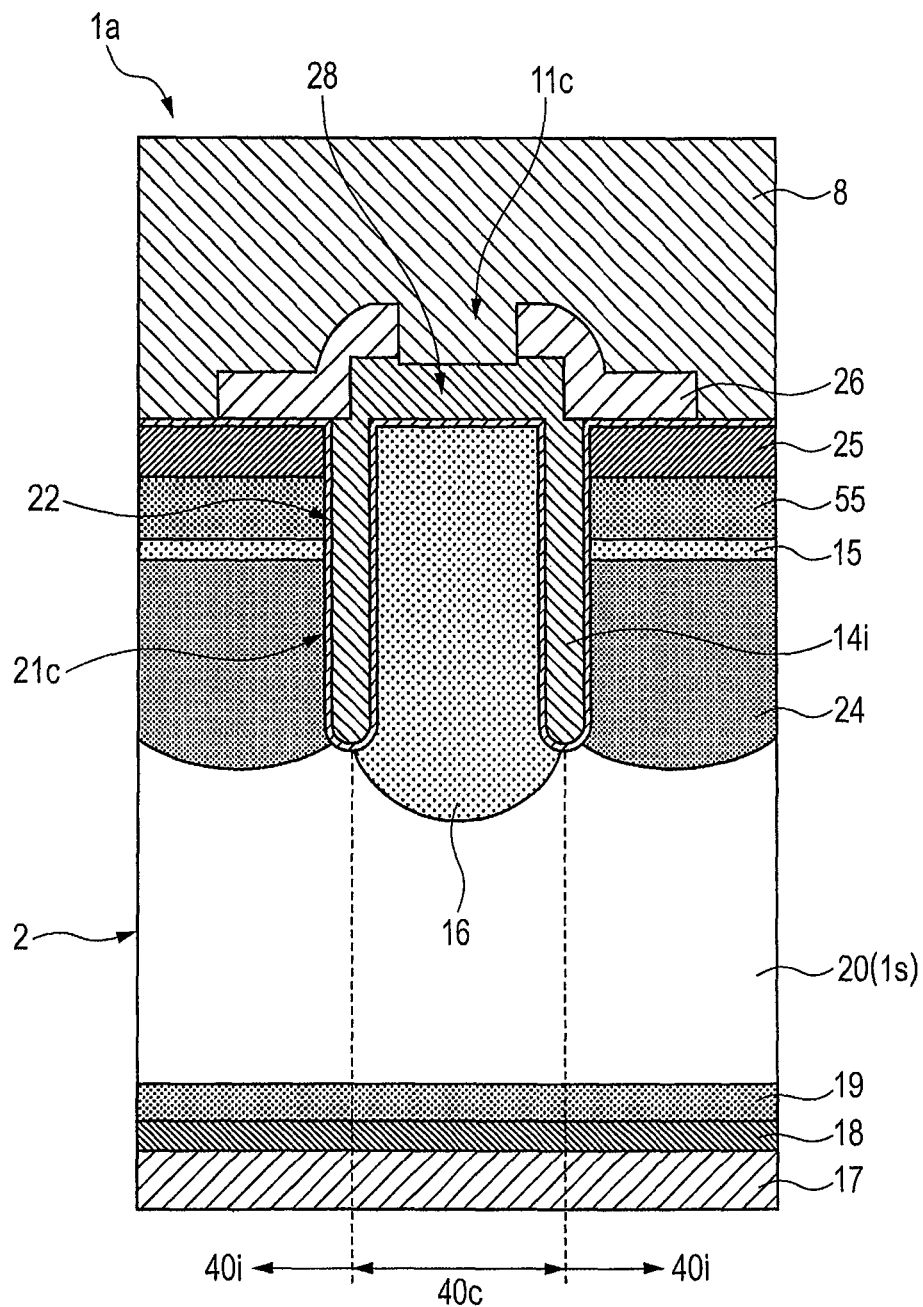
Figure 35:
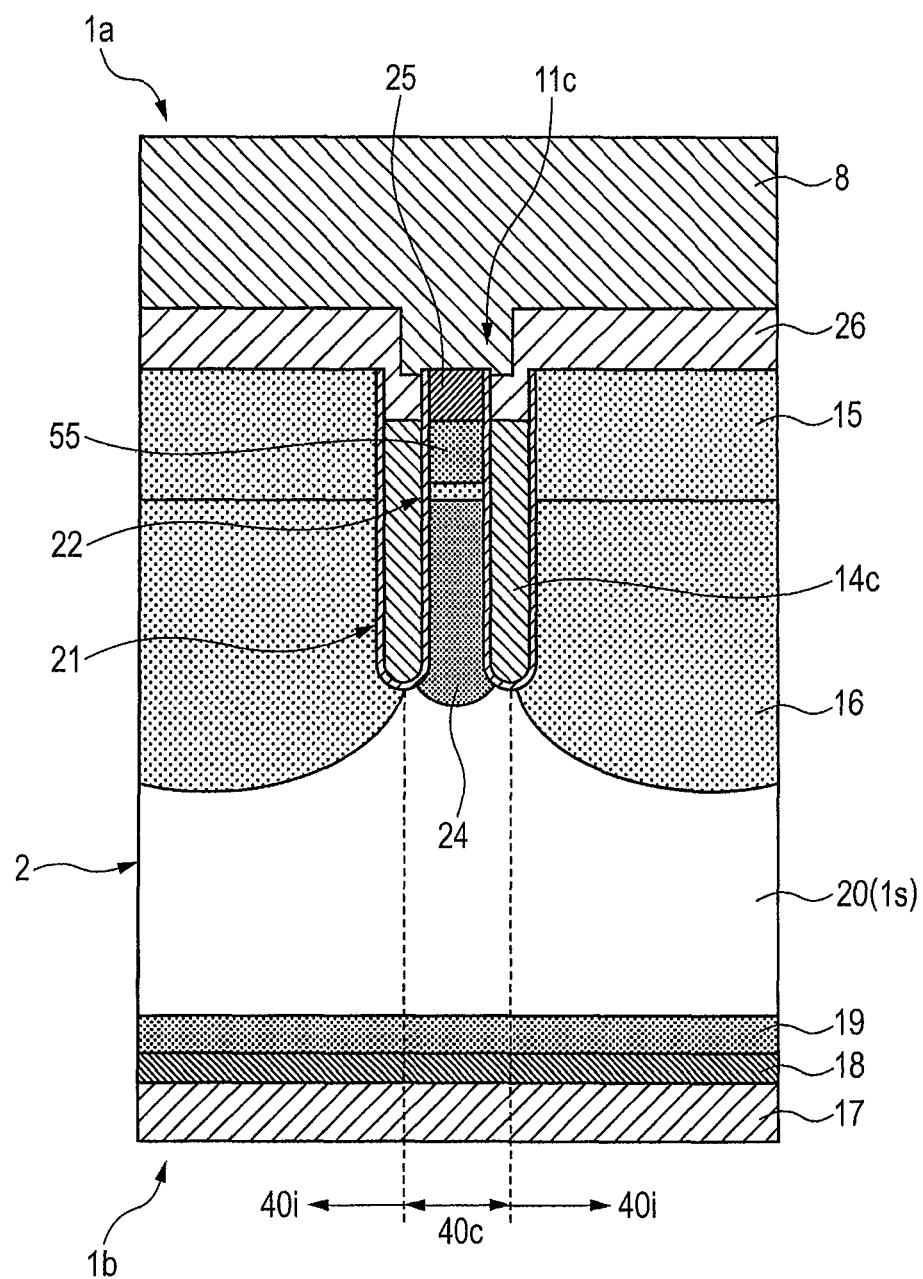
Figure 36:
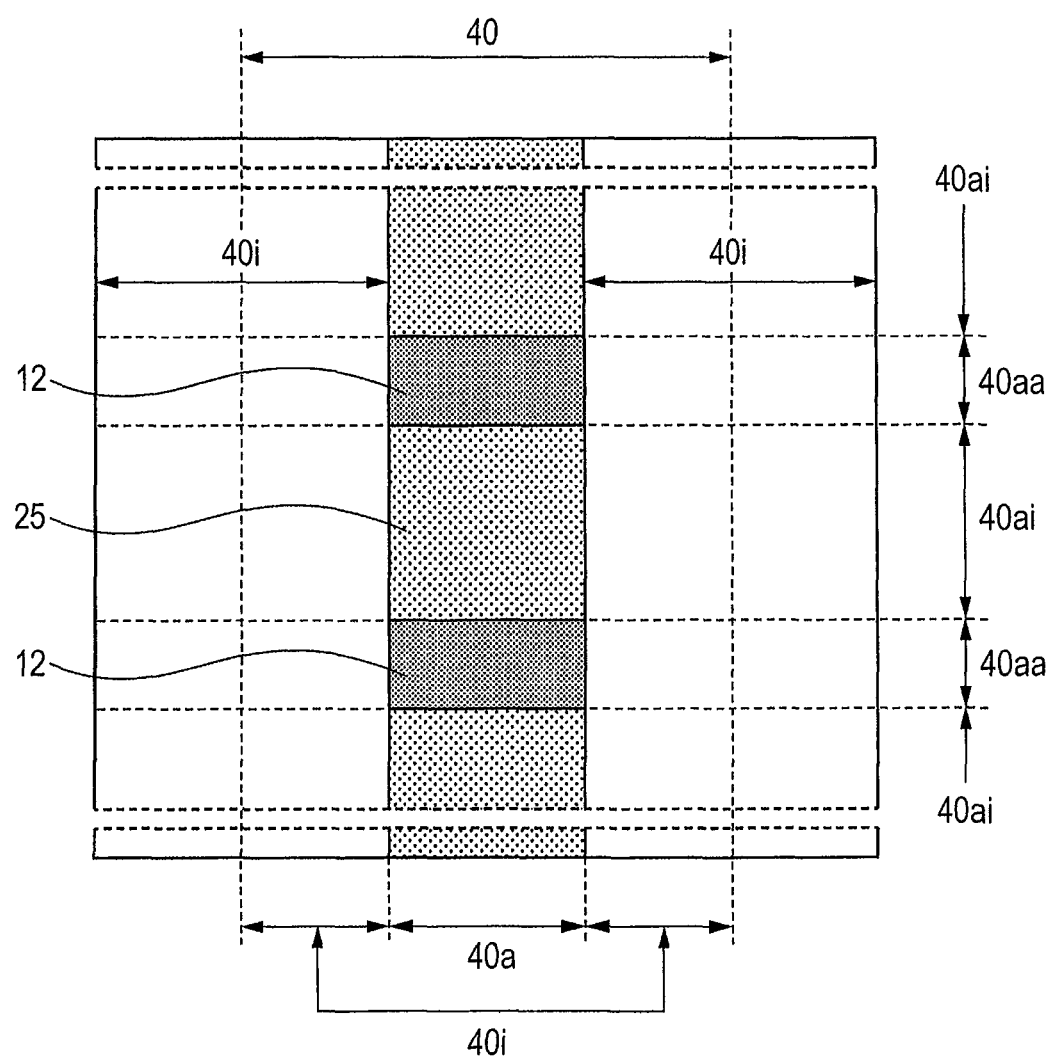

FIG. 15 is a device cross-sectional view in a manufacturing step (trench processing hard mask removing step) corresponding to FIG. 7 for illustrating a manufacturing method corresponding to the device structure of the one embodiment of the present invention;

FIG. 16 is a device cross-sectional view in a manufacturing step (drive-in diffusion and gate oxidation step) corresponding to FIG. 7 for illustrating a manufacturing method corresponding to the device structure of the one embodiment of the present invention;

FIG. 17 is a device cross-sectional view in a manufacturing step (gate polysilicon etching back step) corresponding to FIG. 7 for illustrating a manufacturing method corresponding to the device structure of the one embodiment of the present invention;

FIG. 18 is a device cross-sectional view in a manufacturing step (P type body region and N+ type emitter region introduction step) corresponding to FIG. 7 for illustrating a manufacturing method corresponding to the device structure of the one embodiment of the present invention;

FIG. 19 is a device cross-sectional view in a manufacturing step (P+ type body contact region and P+ type buried body contact region introduction step) corresponding to FIG. 8 for illustrating a manufacturing method corresponding to the device structure of the one embodiment of the present invention;

FIG. 20 is a device cross-sectional view in a manufacturing step (interlayer insulation film deposition step) corresponding to FIG. 7 for illustrating a manufacturing method corresponding to the device structure of the one embodiment of the present invention;

FIG. 21 is a device cross-sectional view in a manufacturing step (contact hole formation step) corresponding to FIG. 7 for illustrating a manufacturing method corresponding to the device structure of the one embodiment of the present invention;

FIG. 22 is a device cross-sectional view in a manufacturing step (surface metal deposition step) corresponding to FIG. 7 for illustrating a manufacturing method corresponding to the device structure of the one embodiment of the present invention;

FIG. 23 is a device cross-sectional view in a manufacturing step (back surface girding and back surface impurity introduction step) corresponding to FIG. 7 for illustrating a manufacturing method corresponding to the device structure of the one embodiment of the present invention;

FIG. 24 is a device cross-sectional view in a manufacturing step (back surface metal electrode formation step) corresponding to FIG. 7 for illustrating a manufacturing method corresponding to the device structure of the one embodiment of the present invention;

FIG. 25 is a local detailed cross-sectional view of the device back surface for a detailed description on the back surface side device structure of the narrow active cell IE type trench gate IGBT of the one embodiment of the present invention, or for illustrating the device structure and the manufacturing method of a modified example (aluminum-doped structure);

FIG. 26 is an enlarged top view corresponding to FIG. 6, for illustrating Modified Example 1 (N+ type surface floating region & P+ type surface floating region addition structure) regarding the surface side device structure of the narrow active cell IE type trench gate IGBT of the one embodiment of the present invention;

FIG. 27 is a device cross-sectional view corresponding to a F-F' cross section of FIG. 26;

FIG. 28 is a device cross-sectional view corresponding to a G-G' cross section of FIG. 26;

FIG. 29 is a device cross-sectional view corresponding to the C-C' cross section of FIG. 6 corresponding to FIG. 7 for illustrating Modified Example 2 (simplified active cell structure) regarding the surface side device structure of the narrow active cell IE type trench gate IGBT of the one embodiment of the present invention;

FIG. 30 is a device schematic cross-sectional view of the A-A' cross section of the cell region end cut-out region R1 of FIG. 1 corresponding to FIG. 2 for illustrating Modified Example 3 (hole collector cell addition structure) regarding the surface side device structure of the narrow active cell IE type trench gate IGBT of the one embodiment of the present invention;

FIG. 31 is an enlarged top view of the linear unit cell region and its periphery R5 of FIG. 1 for illustrating Modified Example 3 (hole collector cell addition structure) regarding the surface side device structure of the narrow active cell IE type trench gate IGBT of the one embodiment of the present invention;

FIG. 32 is an enlarged top view corresponding to FIG. 6 for illustrating Modified Example 3 (hole collector cell addition structure) regarding the surface side device structure of the narrow active cell IE type trench gate IGBT of the one embodiment of the present invention;

FIG. 33 is a device cross-sectional view corresponding to a H-H' cross section of FIG. 32;

FIG. 34 is a device cross-sectional view corresponding to a J-J' cross section of FIG. 32;

FIG. 35 is a device cross-sectional view corresponding to a K-K' cross section of FIG. 32; and FIG. 36 is an enlarged top view of the linear unit cell region and its periphery R5 of FIG. 1 for illustrating the outline of the device structure of the one embodiment of the present invention.

DETAILED DESCRIPTION

Summary of Embodiments

First, a description will be given to the summary of representative embodiments disclosed in the present invention.

1. A narrow active cell IE type trench gate IGBT includes:

(a) a silicon type semiconductor substrate having a first main surface and a second main surface;

(b) an IGBT cell region arranged on the first main surface side of the silicon type semiconductor substrate;

(c) a plurality of linear active cell regions and a plurality of linear inactive cell regions arranged in the IGBT cell region;

(d) a plurality of active sections and a plurality of inactive sections alternately arrayed along the longitudinal direction of the each linear active cell region;

(e) a trench arranged in the first main surface of the silicon type semiconductor substrate, and at a boundary part between the each linear active cell region and the each linear inactive cell region;

(f) a gate electrode arranged in the trench via an insulation film;

(g) an emitter region having a first conductivity type, arranged in a surface region on the first main surface side of the silicon type semiconductor substrate, and over almost the entire region of the each active section;

(h) a body contact region having a second conductivity type, arranged in the surface region on the first main surface side of the silicon type semiconductor substrate, and in the each inactive section; and (i) a metal emitter electrode arranged over the first main surface of the silicon type semiconductor substrate, and electrically coupled to the emitter region and the body contact region.

2. In the narrow active cell IE type trench gate IGBT according to the item 1, the body contact region is arranged over almost the entire region of the each inactive section.

3. The narrow active cell IE type trench gate IGBT according to the item 1 or 2, further includes:

(j) a second conductivity type floating region arranged in the surface region on the first main surface side of the silicon type semiconductor substrate, and in almost the entire region of the each linear inactive cell region, in such a manner as to extend to the bottom ends of the trenches on the opposite sides thereof.

4. The narrow active cell IE type trench gate IGBT according to any one of the items 1 to 3, further includes:

(k) a hole barrier region having the first conductivity type, arranged in the surface region on the first main surface side of the silicon type semiconductor substrate, and in almost the entire region of the each linear active cell region, to the same level of depth as that of the bottom ends of the trenches on the opposite sides thereof.

5. The narrow active cell IE type trench gate IGBT according to any one of the items 1 to 4, further includes:

(m) a buried body contact region having the second conductivity type, arranged in almost the entire surface of the layer underlying the body contact region in such a manner as to be in contact therewith.

6. In the narrow active cell IE type trench gate IGBT according to any one of the items 1 to 5, the interval between the trenches on the opposite sides of the each linear active cell region is 0.35 micrometer or less.

7. In the narrow active cell IE type trench gate IGBT according to any one of the items 1 to 6, the width in the longitudinal direction of the each active section is 0.5 micrometer or less.

8. The narrow active cell IE type trench gate IGBT according to any one of the items 1 to 7, further includes:

(n) a first conductivity type surface floating region arranged in the surface region on the first main surface side of the silicon type semiconductor substrate, and in the each linear inactive region at a position on the extension of the emitter region in the adjacent linear active region.

9. The narrow active cell IE type trench gate IGBT according to any one of the items 1 to 8, further includes:

(p) a second conductivity type surface floating region arranged in the surface region on the first main surface side of the silicon type semiconductor substrate, and in the each linear inactive region at a position on the extension of the body contact region in the adjacent linear active region.

10. The narrow active cell IE type trench gate IGBT according to any one of the items 1 to 9, further includes:

(q) a hole collector cell region arranged in such a manner as to alternately substitute for the linear active cell regions.

11. The narrow active cell IE type trench gate IGBT according to any one of the items 1 to 10, further includes:

(r) a drift region having the first conductivity type, arranged from the inside to the first main surface in almost the entire region of the silicon type semiconductor substrate;

(s) a field stop region arranged on the second main surface side of the drift region in almost the entire region of the silicon type semiconductor substrate, having the first conductivity type, and having a higher concentration than that of the drift region;

(t) a collector region having the second conductivity type, arranged on the second main surface side of the field stop region in almost the entire region of the silicon type semiconductor substrate;

(v) an aluminum doped region arranged on the second main surface side of the collector region in almost the entire region of the silicon type semiconductor substrate, and having a higher concentration than that of the collector region; and (w) a metal collector electrode arranged in almost the entire region of the second main surface of the silicon type semiconductor substrate.

Herein, a portion of the metal collector electrode in contact with the aluminum doped region is a back surface metal film including aluminum as a main component.

12. A method for manufacturing a narrow active cell IE type trench gate IGBT which includes:

(a) a silicon type semiconductor wafer having a first main surface and a second main surface;

(b) an IGBT cell region arranged on the first main surface side of the silicon type semiconductor wafer;

(c) a drift region having a first conductivity type, arranged from the inside to the first main surface in almost the entire region of the silicon type semiconductor wafer;

(d) a body region having a second conductivity type, arranged in the surface region on the first main surface side of the silicon type semiconductor wafer, and in almost the entire surface of the IGBT cell region;

(e) a plurality of linear active cell regions and a plurality of linear inactive cell regions arranged in the IGBT cell region;

(f) a plurality of active sections and a plurality of inactive sections alternately arrayed along the longitudinal direction of the each linear active cell region;

(g) a trench arranged in the first main surface of the silicon type semiconductor wafer, and at the boundary part between the each linear active cell region and the each linear inactive cell region;

(h) a gate electrode arranged in the trench via an insulation film;

(i) an emitter region having the first conductivity type, arranged in the surface region of the body region, and over almost the entire region of the each active section;

(j) a body contact region having the second conductivity type, arranged in the surface region of the body region, and in the each inactive section;

(k) a second conductivity type floating region arranged in the surface region on the first main surface side of the silicon type semiconductor wafer, and in almost the entire region of the each linear inactive cell region, in such a manner as to extend to the bottom ends of the trenches on the opposite sides thereof, and having a larger depth than that of the body region; and (m) a metal emitter electrode arranged over the first main surface of the silicon type semiconductor wafer, and electrically coupled to the emitter region and the body contact region.

The method includes the following steps:

(x1) introducing second conductivity type impurities for forming the second conductivity type floating region in the first main surface of the silicon type semiconductor wafer;

(x2) after the step (x1), forming the trench;

(x3) after the step (x2), carrying out drive-in diffusion with respect to the impurities introduced in the step (x1);

(x4) after the step (x3), forming the gate electrode; and (x5) after the step (x4), introducing second conductivity type impurities for forming the body region.

13. The method for manufacturing a narrow active cell IE type trench gate IGBT according to the item 12, further includes a step of:

(x6) before the step (x1), introducing first conductivity type impurities for forming a hole barrier region into the first main surface of the silicon type semiconductor wafer.

14. In the method for manufacturing a narrow active cell IE type trench gate IGBT according to the item 12 or 13, the step (x1) is also used for introducing second conductivity type impurities for forming a floating field ring arranged in the peripheral outside of the IGBT cell region.

15. The method for manufacturing a narrow active cell IE type trench gate IGBT according to any one of the items 12 to 14, further includes a step of:

(x7) after the step (x5), introducing first conductivity type impurities for forming the emitter region.

16. The method for manufacturing a narrow active cell IE type trench gate IGBT according to the item 15, further includes a step of:

(x8) after the step (x7), introducing second conductivity type impurities for forming the body contact region.

EXPLANATION OF DESCRIPTION FORM, BASIC TERMS, AND METHODS IN THE PRESENT INVENTION

1. In the present invention, the embodiment may be described in a plurality of divided sections for convenience, if required. However, unless otherwise specified, these are not independent of each other, but are respective portions of a single example, or are in a relation such that one is details of a part, a modified example, or the like of a part or the whole of the other. Further, in principle, description on the similar portions is not repeated. Furthermore, respective structural elements in embodiments are not essential, unless otherwise specified, and except when they are theoretically limited to the numbers, and unless otherwise apparent from the context.

Further, the term "semiconductor device" used in the present invention embraces, mainly, various transistors (active elements) alone, or the one obtained by integrating resistors, capacitors, and the like around them as the center over a semiconductor chip or the like (for example, single crystal silicon substrate), and the one obtained by packaging semiconductor chips and the like. Herein, representative examples of the various transistors may include MISFETs (Metal Insulator Semiconductor Field Effect Transistors) typified by MOSFETs (Metal Oxide Semiconductor Field Effect Transistors). Then, representative examples of the various single transistors may include power MOSFETs and IGBTs (Insulated Gate Bipolar Transistors). These are generally classified into power semiconductor devices, which include therein, other than power MOSFETs and IGBTs, bipolar power transistors, thyristors, power diodes, and the like.

Representative form of the power MOSFET is a double diffused vertical power MOSFET including a source electrode at the front surface, and a drain electrode at the back surface. The double diffused vertical power MOSFETs can be mainly classified into two kinds. The first is a planar gate type mainly described in embodiments, and the second is a trench gate type such as U-MOSFET.

The power MOSFETs includes, other than these, LD-MOSFETs (lateral-diffused MOSFETs).

2. Similarly, in the description of embodiments, and the like, even the term "X including A" or the like for the material, composition, or the like does not exclude the one including an element other than A as a main structural element unless otherwise specified and unless otherwise apparent from the context. For example, for the component, the term is used to embrace "X including A as a main component", and the like. For example, it is naturally understood that even the term "silicon member" or the like herein used is not limited to pure silicon but also embraces a SiGe alloy, other multinary alloys containing silicon as a main component, and other members containing additives, and the like.

Similarly, the terms "silicon oxide film", "silicon oxide type insulation film", and the like are used to embrace insulation films including not only relatively pure undoped silicon dioxide, but also other silicon oxides as main components. For example, impurity-doped silicon oxide type insulation films such as TEOS-based silicon oxide, PSG (phosphorus silicate glass), and BPSG (borophosphosilicate glass) are also silicon oxide films. Whereas, other than thermal oxide films and CVD oxide films, coating type films such as SOG (Spin On Glass) and NSC (nano-clustering silica) are also silicon oxide films or silicon oxide type insulation films. Other than these, a low-k insulation film such as FSG (fluorosilicate glass), SiOC (Silicon Oxicarbide), carbon-doped silicon oxide, or OSG (organosilicate glass) is also similarly a silicon oxide film or a silicon oxide type insulation film. Further, the silica type low-k insulation films obtained by introducing holes into the same members as these (porous type insulation films, the "porous" herein used also embraces molecular porous) are also silicon oxide films or silicon oxide type insulation films Further, silicon type insulation films which are commonly used along with silicon oxide type insulator films in the field of semiconductors include silicon nitride type insulation films. Materials belonging to such a group include SiN, SiCN, SiNH, SiCNH, or the like. The term "silicon nitride" herein used embraces both SiN and SiNH unless otherwise specified. Similarly, the term "SiCN" herein used embraces both SiCN and SiCNH unless otherwise specified.

3. Similarly, although preferred examples are shown with respect to configuration, position, attribute, and the like, it is naturally understood that the present invention is not strictly limited thereto unless otherwise specified and unless otherwise apparent from the context.

4. Further, also when specific numerical values and quantities are mentioned, unless otherwise specified, except when they are theoretically limited to the numbers, and unless otherwise apparent from the context, each numerical value may be a numerical value of more than the specific numerical value, or may be a numerical value of less than the specific numerical value.

5. The term "wafer" herein used generally refers to a single crystal silicon wafer over which a semiconductor device (which may be a semiconductor integrated circuit device or an electronic device) is to be formed. However, it is naturally understood that the term also embraces a composite wafer of insulation substrate such as an epitaxial wafer, a SOI substrate, or a LCD glass substrate, and a semiconductor layer or the like.

6. Similarly to the previous description on the power MOSFETs, in general, IGBTs are largely classified into a planar gate type and a trench gate type. The trench gate type IGBT has a relatively lower ON resistance. However, in order to further promote the conductivity modulation, and to further reduce the ON resistance, there has been developed "an IE type trench gate IGBT" (or "active cell thinned-out type trench gate IGBT") utilizing the IE (Injection Enhancement) effect. The IE type trench gate IGBT has the following structure: in the cell region, active cells actually coupled to an emitter electrode, and inactive cells having P type floating regions are arranged alternately, or in the form of the teeth of a comb, thereby to facilitate the accumulation of holes on the device main surface side (emitter side) of a semiconductor substrate. Incidentally, the P type floating region is not essential. However, the presence of a P type floating region (i.e., a P type deep floating region) having a depth enough to cover the lower ends of the trenches on the opposite sides provides a merit of facilitating breakdown voltage design.

Incidentally, in the present invention, there are a plurality of active cells. The first is an intrinsic active cell which actually has an N+ emitter region, and in which a trench gate electrode is electrically coupled to a metal gate electrode (specifically, a linear active cell region). The second is a pseud active cell which does not have an N+ emitter region, and in which a trench gate electrode is electrically coupled to a metal emitter electrode (specifically, a linear hole collector cell region).

7. In the present invention, of the IE type trench gate IGBTs, the one in which the width of the main active cell is narrower than the width of the main inactive cell is referred to as a "narrow active cell IE type trench gate IGBT". More generally, the term refers to the one in which the pitch between the trenches (the distance between the trench centers) of the active cell is narrower than the pitch between trenches of the inactive cell.

Further, the direction crossing the trench gate is referred to as a "width direction of the cell" and the direction of extension (longitudinal direction) of the trench gate (linear gate portion) orthogonal thereto is referred to as a "length direction of the cell".

The present invention mainly deals with the "linear unit cell region" (including, for example, the linear active cell region and the linear inactive cell region). The linear unit cell regions are arrayed in a periodically repeating manner in the inside region of the semiconductor chip, to form a "cell formation region", i.e., an "IGBT cell region".

Around the cell region, generally, there is arranged a cell peripheral junction region. Further, therearound, a floating field ring or a field limiting ring, and the like are arranged, thereby to form a termination structure. Herein, the term "floating field ring" or "field limiting ring" refers to the following. Namely, the term refers to an impurity region or an impurity region group arranged apart from a P type body region (P type well region) in the front surface (device surface) of the drift region, having the same conductivity type as that, and the similar concentration to that (which is a concentration enough to prevent full depletion when the main junction is applied with a reverse voltage), and surrounding the cell region in one-fold or multi-fold (e.g., about 10-fold) rings.

Further, in the floating field rings, there may be arranged a field plate. The field plate is a conductor film pattern coupled to the floating field ring, and refers to a portion which extends over the front surface (device surface) of the drift region via an insulation film, and surrounds the cell region in a ring.

Figure 5:
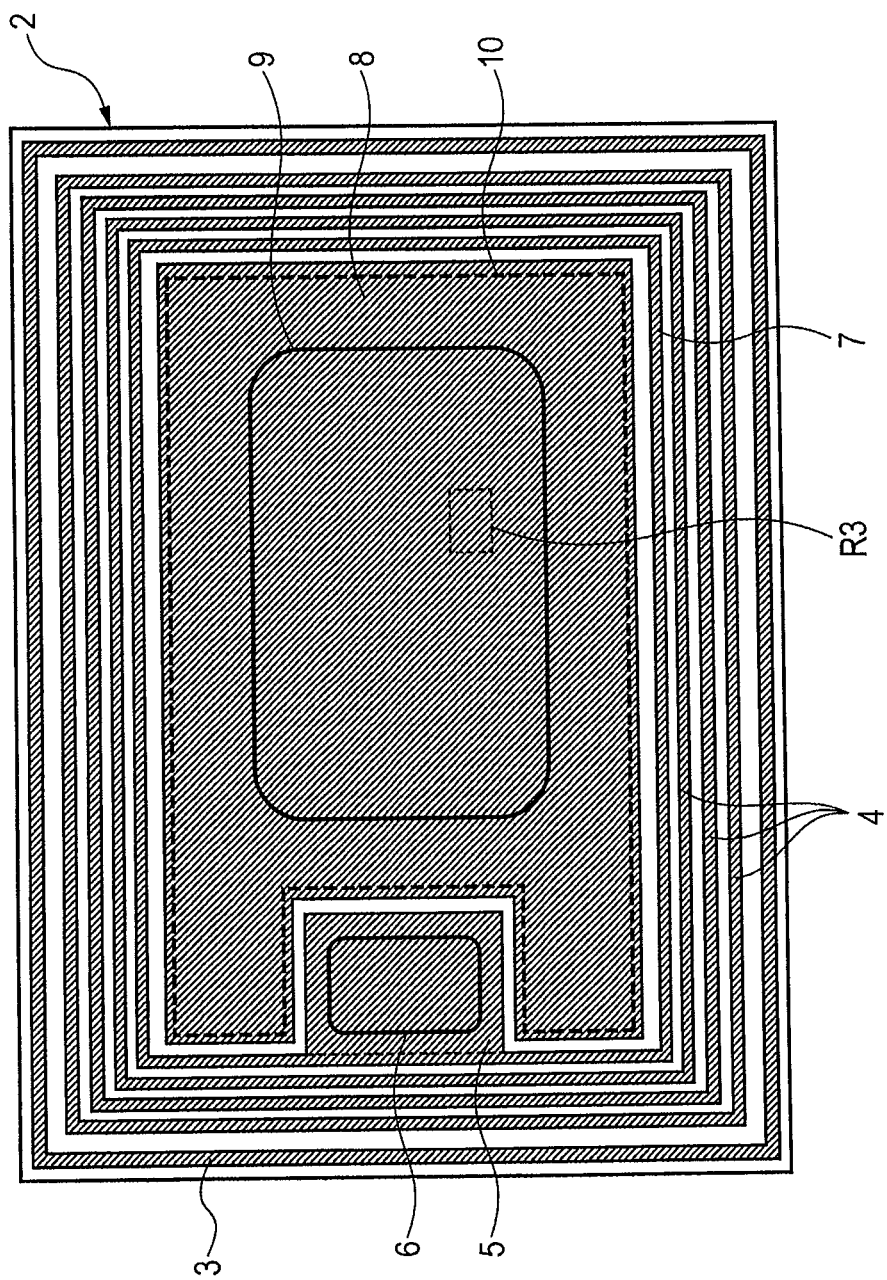
FIG. 5 is an overall top view (roughly corresponding to FIG. 1, but close to a more specific configuration) of the narrow active cell IE type trench gate IGBT device chip of the one embodiment (also common to other embodiments and respective modified examples) of the present invention.

The linear unit cell region as a periodical element forming the cell region refers to the following, for example, in the example of FIG. 5. Namely, the one in which half-width linear inactive cell regions are arranged on the opposite sides of the linear active cell region as the center is rationally treated as a set. However, specifically, when the linear inactive cell regions are individually described, they are inconveniently separated to opposite sides. For this reason, in that case, a specific integral portion is referred to as a linear inactive cell region.

Incidentally in the following example, a "contact substrate trench" commonly used for implementing an "ultra-narrow active region" is not formed, but a contact trench is formed in the interlayer insulation film over a flat substrate surface. Herein, in the present invention, the term "ultra-narrow active region" refers to the one having a distance between the inner sides of the trenches on the opposite sides of the active cell region, namely, a width of the active region between trenches of 0.35 micrometer or less. Whereas, the one having a width in the longitudinal direction of the active section (referred to as an "active section width") of 0.5 micrometer or less is referred to as an "ultra-narrow active section".

Details of Embodiments

Embodiments will be further described in details. In respective drawings, the same or similar portions are indicated with the same or similar reference signs and reference numerals, and a description thereon will not be repeated in principle.

Further, in the accompanying drawings, hatching or the like may be omitted even in cross section when it rather complicates the drawing, or when it is apparently distinct from the gap. In conjunction with this, when apparent from the description or the like, or in other cases, even for a two-dimensionally closed hole, the background outline may be omitted. Further, even not in cross section, hatching may be added in order to clearly demonstrate that the part is not a gap.

Incidentally, regarding the designation in the alternative case, when one is referred to as "first", and the other is referred to as "second", or the like, they may be exemplified correspondingly in accordance with representative embodiments. However, it is naturally understood that, for example, even the term "first" is not limited to the exemplified alternatives.

Incidentally, as the prior patent applications disclosing an IE type IGBT having different-interval trenches, there are, for example, Japanese Patent Application No. 2012-19942 (filing date in Japan, Feb. 1, 2012), Japanese Patent Application No. 2012-577 (filing date in Japan, Jan. 5, 2012), and Japanese Patent Application No. 2011-127305 (filing date in Japan, Jun. 7, 2011).

1. Explanation of Outline of Device Structure in Narrow Active Cell IE Type Trench Gate IGBT in Main Embodiment (Including Modified Example) of the Present Invention (Mainly FIGS. 1 to 4)

In this section, specific examples are shown, thereby to complement the previous definitions, and representative specific examples of the present invention are drawn, and the outline thereof is illustrated. In addition, the overall preliminary description is given. Incidentally, in FIGS. 2 and 3, in order to ensure the simplicity of the wide area view, the structure of some impurity region is shown in a largely simplified form (for the detailed structure, see, e.g., FIG. 4).

Figure 3:
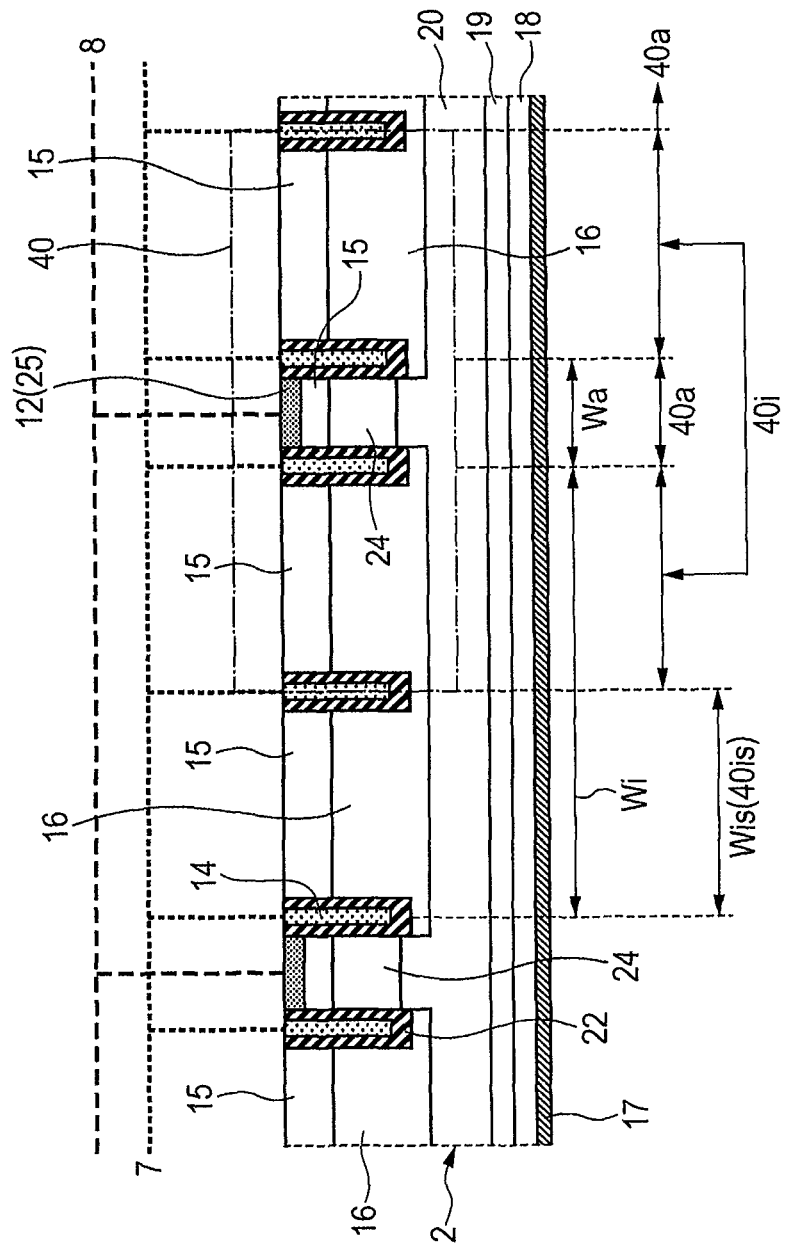
FIG. 3 is a device schematic cross-sectional view corresponding to a B-B' cross section of a cell region internal cut-out region R2 of FIG. 1.
Figure 4:
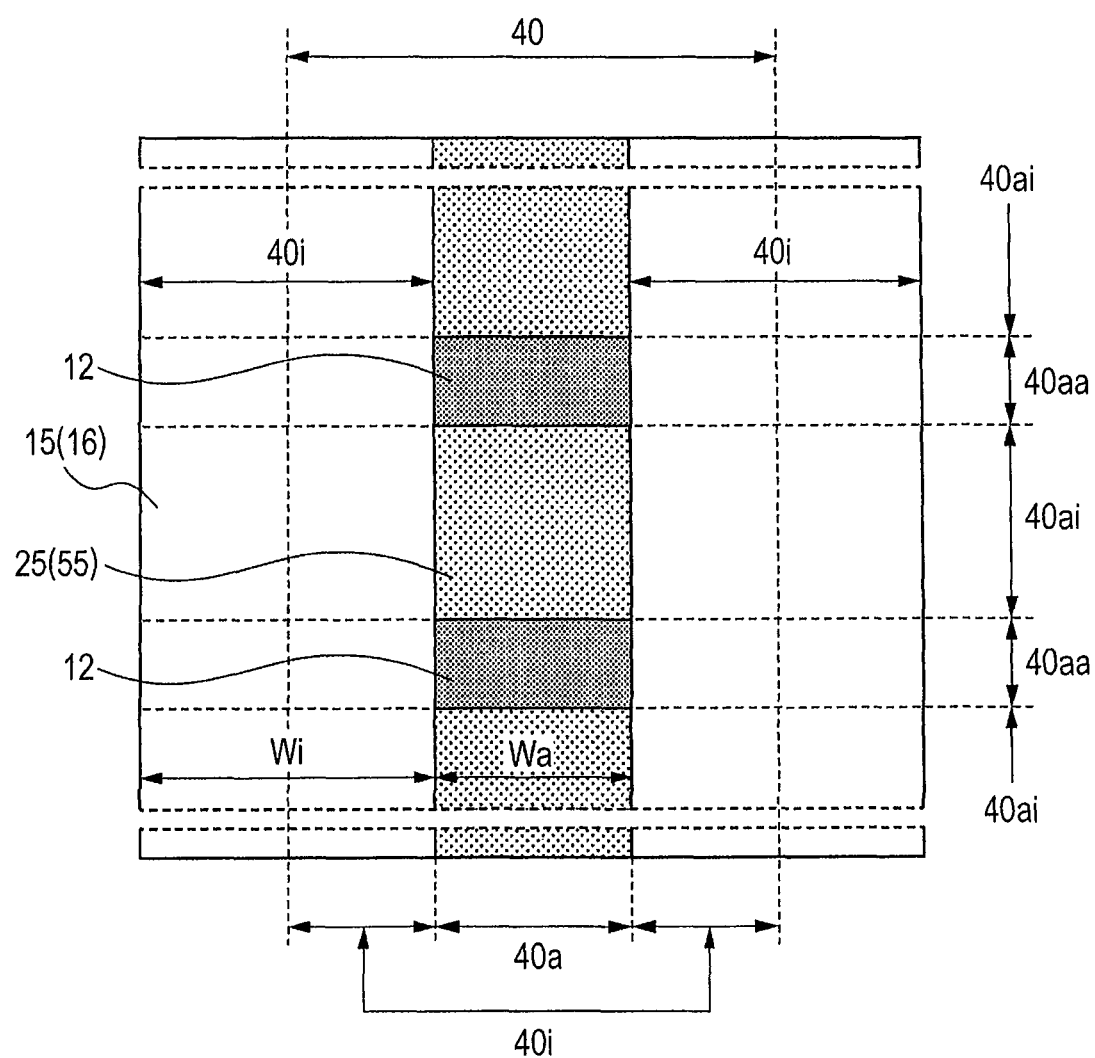
FIG. 4 is an enlarged top view of a linear unit cell region and its periphery R5 of FIG. 1 in accordance with one embodiment of the present invention.

FIG. 1 is a top schematic layout view of a cell region and its periphery of a narrow active cell IE type trench gate IGBT device chip for illustrating the outline of the device structure in a narrow active cell IE type trench gate IGBT of main embodiments (including modified examples) of the present invention. FIG. 2 is a device schematic cross-sectional view corresponding to an A-A' cross section of a cell region end cut-out region R1 of FIG. 1. FIG. 3 is a device schematic cross-sectional view corresponding to a B-B' cross section of a cell region internal cut-out region R2 of FIG. 1. FIG. 4 is an enlarged top view of a linear unit cell region and its periphery R5 of FIG. 1 in accordance with one embodiment of the present invention. Based on these, a description will be given to the outline of the device structure in the narrow active cell IE type trench gate IGBT in the main embodiment (including a modified example).

(1) Explanation of Cell Region and its Peripheral Planar Structure (Mainly FIG. 1):

First, FIG. 1 shows the top view of the inside region (the portion inside a guard ring or the like which is the outermost part of the termination structure, i.e., the main part of a chip 2) of the IE type trench gate IGBT which is the main object of the present invention. As shown in FIG. 1, the main part of the internal region of the chip 2 (semiconductor substrate) is occupied by an IGBT cell region 10. In the outer circumferential part of the cell region 10, a ring-shaped and P type cell peripheral junction region 35 is arranged in such a manner as to surround this. Outside the cell peripheral junction region 35, a single or a plurality of ring-shaped and P type floating field rings 36 (i.e., field limiting rings) are arranged at an interval, and form a termination structure for the cell region 10 together with the cell peripheral junction region 35, a guard ring 4 (see FIG. 5), and the like.

In the cell region 10, in this example, a large number of linear unit cell regions 40 are spread. In the end regions thereof, there are arranged a pair of or more (for one side, one row or about several rows) of dummy cell regions 34 (linear dummy cell regions).

(2) Explanation of Narrow Active Cell Type Unit Cell and Alternate Array System (Mainly FIG. 2):

Then, FIG. 2 shows the A-A' cross section of the cell region end cut-out region R1 of FIG. 1. As shown in FIG. 2, in the semiconductor region (in this example, silicon single crystal region) of the back surface 1b (the back side main surface or the second main surface of the semiconductor substrate) of the chip 2, there is arranged a P+ type collector region 18. Over the surface, there is arranged a metal collector electrode 17. Between an N- type drift region 20 (first conductivity type drift region) forming the main part of the semiconductor substrate 2 and the P+ type collector region 18 (second conductivity type collector region), there is arranged an N type field stop region 19 (first conductivity type field stop region).

On the other hand, in the semiconductor region on the front surface side 1a (the front side main surface or the first main surface of the semiconductor substrate) of the N- type drift region 20, there are arranged a large number of trenches 21. Therein, trench gate electrodes 14 are embedded via a gate insulation film 22, respectively. The trench gate electrodes 14 are coupled via a metal gate wire 7 to a metal gate electrode 5 (see FIG. 5).

Further, the trenches 21 perform a function of defining respective regions. For example, a dummy cell region 34 is defined from opposite sides thereof by a pair of trenches 21. One trench 21 of these defines the cell region 10 and the cell peripheral junction region 35. The cell peripheral junction region 35 is coupled via a P+ type body contact region 25p to a metal emitter electrode 8. Incidentally, in the present invention, unless otherwise specified, the thickness of the gate insulation film 22 at any portion of the trench is assumed to be roughly equal (however, it is not excluded that, if required, a given portion is different in thickness from other portions). Thus, in the cell peripheral junction region 35 and the dummy cell region 34, an emitter contact is established. As a result, even when the width of the dummy cell region 34 or the like is changed in layout, it is possible to prevent the reduction of the breakdown voltage. Namely, the degree of freedom for design is improved.

In the semiconductor region on the front surface side 1a of the N- type drift region 20 outside the cell peripheral junction region 35, there is arranged a P type floating field ring 36. Over the front surface 1a, a field plate 4 is arranged, and is coupled via a P+ type body contact region 25r to the floating field ring 36.

Then, the cell region 10 will be further described. The dummy cell region 34 is basically equal in both structure and size to the linear active cell region 40a except for not having an N+ type emitter region 12. A P+ type body contact region 25d arranged in the front surface of the P type body region 15 is coupled to the metal emitter electrode 8.

Most of the inside region of the cell region 10 basically has a repeating structure of translational symmetry with the linear unit cell region 40 as a unit cell (incidentally, symmetry in a strict sense is not required. The same shall apply hereinafter). The linear unit cell region 40 as the unit cell includes the linear active cell region 40a, and half-width linear inactive cell regions 40i on the opposite sides thereof. However, specifically, it can be seen that full-width linear inactive cell region 40i is arranged between the adjacent linear active cell regions 40a (see FIG. 4).

In the semiconductor surface region on the front side main surface 1a (first main surface) side of the semiconductor substrate of the linear active cell region 40a, there is arranged the P type body region 15. In the front surface thereof, there are arranged an N+ type emitter region 12 (first conductivity type emitter region) and a P+ type body contact region 25. The N+ type emitter region 12 and the P+ type body contact region 25 are coupled to the metal emitter electrode 8. In the linear active cell region 40a, in the N- type drift region 20 under the P type body region 15, there is arranged an N type hole barrier region 24. In each example of the present invention, when the N type hole barrier region 24 is arranged, in principle, from the two-dimensional viewpoint, it is arranged in almost the entire region of the linear active cell region 40a. Incidentally, it is naturally understood that this is not essential, and can also be partially arranged, if required.

On the other hand, in the front side main surface 1a (first main surface) side semiconductor surface region of the semiconductor substrate in the linear inactive cell region 40i, similarly, the P type body region 15 is arranged. In the underlying N- type drift region 20, there is arranged a P type floating region 16 (second conductivity type floating region) covering the lower ends of the trenches 21 on the opposite sides, and deeper than them. By arranging such a P type floating region 16, it is possible to widen the width Wi of the linear inactive cell region without causing a sharp reduction of the breakdown voltage. For example, even when the layout is adjusted in order to optimize the characteristics such as the gate capacity, ON voltage, and switching characteristics, there is no fear of the reduction of the breakdown voltage, and the degree of freedom for design can be ensured. Further, for example, when the concentration of the N type hole barrier region 24 is increased for optimization, similarly, there is almost no effect on the breakdown voltage. As a result of this, it becomes possible to effectively enhance or control the hole accumulation effect. Incidentally, in the IE type trench gate IGBT, there is not formed a contact from the emitter electrode 8 to the P type floating region 16. This is as follows: the direct hole discharge path from the P type floating region 16 to the emitter electrode 8 is blocked, which results in an increase in hole concentration of the N− type drift region 20 (N base region) under the linear active cell region 40a; as a result, the electron concentration to be injected from the MOSFET into the N base region in the IGBT is improved, thereby to reduce the ON resistance.

In this example, the width Wa of the linear active cell region 40a is set narrower than the width Wi of the linear inactive cell region 40i. In the present invention, this is referred to as a "narrow active cell type unit cell". Below, mainly, a device having the narrow active cell type unit cell will be specifically described. However, the present invention is not limited thereto. It is naturally understood that the present invention is also applicable to a device having a "non-narrow active cell type unit cell".

In the example of FIG. 2, the linear active cell regions 40a and the linear inactive cell regions 40i are alternately arrayed to form the linear unit cell region 40. This configuration is referred to as an "alternate array system" in the present invention. Below, unless otherwise specified (specifically, basically other than FIG. 3), a description will be given on the premise of the alternate array system. However, it is naturally understood that the "non-alternate array system" is also acceptable.

In FIG. 2, a description was given to the main part exemplarily including respective portions of various embodiments of the present invention. However, in the following description, these are divided into structural elements such as a cell part (cross-sectional or planar structure), and a cell peripheral part to be described. However, these are not individually independent of one another. As shown in FIG. 2, various modified examples substitute for respective structural elements to form the main part. This is not limited to FIG. 2, and can also apply to the subsequent FIG. 3.

In FIG. 2 (alternate array system), the one obtained by substituting every other active cell with a hole collector cell is the structure shown in FIG. 30 or the like. However, it is naturally understood that the same substitution can also be carried out in the non-alternate array system as in FIG. 3.

(3) Explanation of Non-Alternate Array System (Mainly FIG. 3):

Then, FIG. 3 shows a specific example of the linear unit cell region 40 of the non-alternate array system. As shown in FIG. 3, in the example of FIG. 2, the number of the linear inactive cell regions 40i to be inserted in between the adjacent linear active cell regions 40a is one. However, in the example of FIG. 3, the number of the linear inactive sub-cell regions 40is (device element corresponding to the linear inactive cell region 40i of FIG. 2) to be inserted in between the adjacent linear active cell regions 40a is plural. Also in the example of the non-alternate array system, mainly, the width Wa of the linear active cell region 40a is set narrower than the width Wis of the linear inactive sub-cell region 40is. As with the foregoing, in the present invention, this is referred to as a "narrow active cell type unit cell". Namely, the definition of the narrow active cell type unit cell is done not by the width Wi of the linear inactive cell region 40i but by the width Wis of the linear inactive sub-cell region 40is. Incidentally, the number (which will be hereinafter referred to as an "insertion number") of the linear inactive sub-cell regions 40is to be inserted in between the adjacent linear active cell regions 40a is not required to be constant, but may be changed between one and several according to the place.

Similarly to this, also in the alternate array system, in some cases, the insertion number may be set plural. Incidentally, the merit of the alternate array system is as follows: the number of trenches is small, and hence the planar structure can be relatively simplified. Further, there is also a merit of preventing an inadvertent increase in gate capacity. On the other hand, the merit of the non-alternate array system resides in that the width Wi of the relatively wider linear inactive cell region can be set without making the gate capacity too small, and without reducing the breakdown voltage. The overall design optimization may become difficult with a too small gate capacity according to the application or the gate drive conditions. For this reason, it is effective to ensure the adjustable means as device design, if required.

(4) Explanation of Active Cell Two-Dimensional Thinned-Out Structure (Mainly FIG. 4)

FIG. 4 shows one example of the detailed planar structure of the linear unit cell region main part and its peripheral cut-out region R5 of FIG. 1. As shown in FIG. 4, in the length direction of the linear active cell region 40a, for example, active sections 40aa having a given length are arranged at a given interval, between which there is an inactive section 40ai not including the N+ type emitter region 12 arranged therein. Namely, some portions in the length direction of the linear active cell region 40a locally and dispersively become the active sections 40aa. A further description will be given. In the active section 40aa, in almost the entire surface thereof, there is arranged the N+ type emitter region 12. In the inactive section 40ai, in almost the entire surface thereof, there are arranged a P+ type body contact region 25 and a P+ type buried body contact region 55. On the other hand, in the linear inactive cell region 40i, in almost the entire surface thereof, there are arranged the P type body region 15 and the P type floating region 16 (second conductivity type floating region).

Incidentally, herein, "being distributed with a given length at a given interval" means "being periodical". However, "being substantially periodical" corresponds to the local and dispersive distribution. However, "being local and dispersive" is "being wider than that" and does not necessarily mean "being periodical or quasi-periodical".

2. Explanation of Device Structure of Narrow Active Cell IE Type Trench Gate IGBT in One Embodiment of the Present Invention (P Type Deep Floating & Hole Barrier Combination Structure) (Mainly FIGS. 5 to 9)

In this section, based on the explanation of Section 1, a description will be given to one example of the specific chip top surface layout and the unit cell structure (active cell one-dimensional thinned-out structure) common to respective embodiments (corresponding to FIGS. 1, 2, and 4 of Section 1). The cell structure described in this section is a narrow active cell type unit cell of the alternate array system.

Incidentally, generally, with an IGBT element 2 with a breakdown voltage of 1200 volts as an example, the chip size is 3 to 15 millimeters square. Thus, the chip size largely varies according to the assumed current value. Herein, for convenience of description, a description will be given by taking a chip 4 millimeters long, and 5.2 millimeters wide as an example. Herein, a description will be given by assuming the breakdown voltage of the device as, for example, about 1200 volts.

Figure 9:
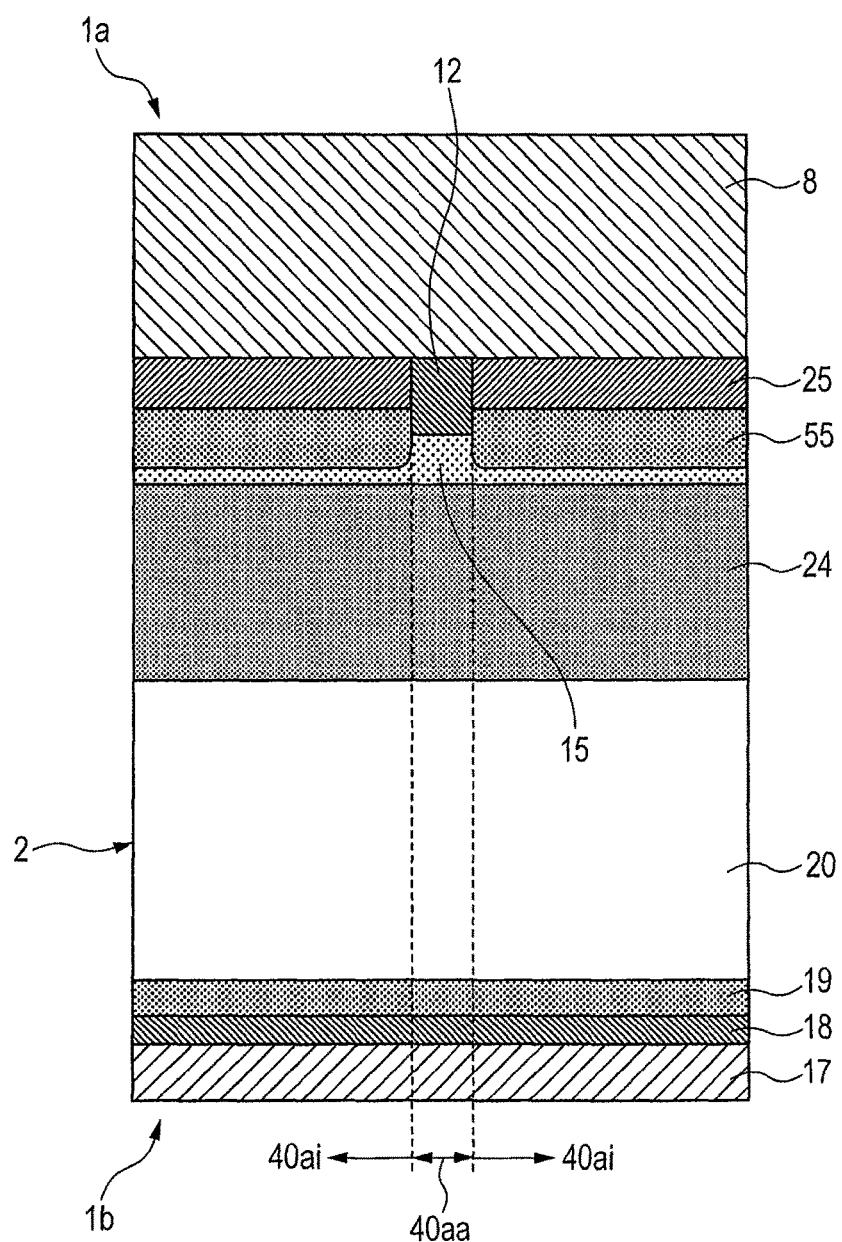
FIG. 9 is a device cross-sectional view corresponding to an E-E' cross section of FIG. 6.

FIG. 5 is an overall top view (roughly corresponding to FIG. 1, but close to a more specific configuration) of the narrow active cell IE type trench gate IGBT device chip of the one embodiment (also common to other embodiments and respective modified examples) of the present invention. FIG. 6 is an enlarged top view of a portion corresponding to the cell region internal cut-out region R3 of FIG. 5 for illustrating the device structure of the one embodiment (an active section dispersed structure in an active cell two-dimensional thinned-out structure) of the present invention. FIG. 7 is a device cross-sectional view corresponding to a C-C' cross section of FIG. 6. FIG. 8 is a device cross-sectional view corresponding to a D-D' cross section of FIG. 6. FIG. 9 is a device cross-sectional view corresponding to an E-E' cross section of FIG. 6. Based on these, a description will be given to the device structure of the narrow active cell IE type trench gate IGBT in one embodiment (P type deep floating & hole barrier combination structure) of the present invention.

As shown in FIG. 5, in the outer circumferential part of the top surface 1a of the IGBT device chip 2, there is arranged a ring-shaped guard ring 3 formed of, for example, an aluminum type wiring layer. In the inside thereof, there are arranged several (single or plural) ring-shaped field plates 4 (formed of, for example, the same aluminum type wiring layer as the previous one) coupled to a ring-shaped floating field ring or the like. Inside the field plate 4 (floating field ring 36), and in the main part of the inside region of the top surface 1a of the chip 2, there is arranged the cell region 10. The top of the cell region 10 is covered to the vicinity of the outside thereof with a metal emitter electrode 8 formed of, for example, the same aluminum type wiring layer as the previous one. The central part of the metal emitter electrode 8 becomes a metal emitter pad 9 to be coupled with a bonding wire or the like. Between the metal emitter electrode 8 and the field plate 4, there is arranged a metal gate wire 7 formed of, for example, the same aluminum type wiring layer as the previous one. The metal gate wire 7 is coupled to the metal gate electrode 5 formed of, for example, the same aluminum type wiring layer as the previous one. The central part of the metal gate electrode 5 becomes a gate pad 6 to be coupled with a bonding wire or the like.

Then, FIG. 6 shows an enlarged planar layout of the cell region internal cut-out region R3 of FIG. 5 (mainly showing the layout of the surface region of the semiconductor substrate). As shown in FIG. 6, the N+ type emitter region 12 is not formed over almost the full length of the linear active cell region 40a. The linear active cell region 40a is almost periodically divided in the length direction thereof into active sections 40aa each including the N+ type emitter region 12 formed therein, and inactive sections 40ai each not including the N+ type emitter region 12 formed therein. Namely, the N+ type emitter region 12 is arranged over almost the entire surface in the active section 40aa of the linear active cell region 40a. The P+ type body contact region 25 is arranged over almost the entire surface in the inactive section 40ai of the linear active cell region 40a. On the other hand, in the linear inactive cell regions 40i separated by the linear active cell regions 40a and the trench gate electrodes 14, the P type body region 15 and the P type floating region 16 are arranged over almost the entire surface thereof.

Then, FIG. 7 shows the C-C' cross section of FIG. 6. As shown in FIG. 7, in the semiconductor region of the back surface 1b of the semiconductor chip 2, a P+ type collector region 18 and an N type field stop region 19 are formed in such a manner as to be vertically in contact with each other. Over the back surface 1b of the semiconductor chip 2, there is formed a metal collector electrode 17.

In the N− type drift region 20 (the semiconductor region on the front surface side of the semiconductor substrate) on the front surface 1a (first main surface) side of the semiconductor chip 2 in the linear active cell region 40a, there are arranged an N type hole barrier region 24, a P type body region 15, and an N+ type emitter region 12 sequentially from the bottom. Further, over the front surface 1a of the semiconductor chip 2, there is formed an interlayer insulation film 26. In the interlayer insulation film 26 portion in the linear active cell region 40a, there is formed a contact trench 11 (or contact hole). The N+ type emitter region 12 is coupled via the contact trench 11 and the like to the metal emitter electrode 8 arranged over the interlayer insulation film 26. The presence of the N type hole barrier region 24 is arbitrary. However, the N type hole barrier region 24 is present, and thereby acts as a hole barrier. In addition, the presence thereof has an effect of preventing the P type floating region 16 from undesirably expanding toward the linear active cell region 40a side even when the width of the linear active cell region 40a becomes very narrow. Further, the disposition of the N type hole barrier region 24 has a merit capable of implementing a sufficient IE effect even when the depth of the trench is not very large (e.g., about 3 micrometers). Further, there is also an effect capable of largely reducing the range of characteristic fluctuation with respect to the variation in trench depth.

Herein, the N type hole barrier region 24 is a barrier region for inhibiting holes from flowing into the path from the N− type drift region 20 to the N+ type emitter region 12. The impurity concentration thereof is, for example, lower than that of the N+ type emitter region 12, and higher than that of the N− type drift region 20. The presence of the N type hole barrier region 24 can effectively inhibit the holes accumulated in the linear inactive cell region 40i from entering into the emitter path (the path from the N− type drift region 20 toward the P+ type body contact region 25) in the linear active cell region 40a. Further, the N type hole barrier region 24 is locally arranged only in the active cell region 40a. This prevents an unnecessary increase in discharge resistance of holes at the time of switching-off, which prevents degradation of the switching characteristics.

In contrast to this, in the N− type drift region 20 on the front surface 1a (first main surface) side of the semiconductor chip 2 in the linear inactive cell region 40i (the surface-side semiconductor region of the semiconductor substrate), a P type floating region 16 and a P type body region 15 are arranged sequentially from the bottom. The depth of the P type floating region 16 is set larger than the depth of the trench 21, and is distributed in such a manner as to cover the lower end of the trench 21. In this manner, it is possible to effectively prevent the concentration of the electric field intensity to the lower end of the trench 21 in the off state.

Then, FIG. 8 shows the D-D' cross section of FIG. 6. As shown in FIG. 8, this cross section is different from FIG. 7 in that the P+ type body contact region 25 is arranged over the front surface of the P type body region 15 in the linear active cell region 40a, and in that a P+ type buried body contact region 55 is arranged in contact with the bottom in a superposed manner. Incidentally, other portions are entirely the same as in FIG. 7.

Then, FIG. 9 shows the E-E' cross section of FIG. 6. As shown in FIG. 9, in the semiconductor region of the back surface 1b of the semiconductor chip 2, a P+ type collector region 18 and an N type field stop region 19 are formed in such a manner as to be vertically in contact with each other. Over the back surface 1b of the semiconductor chip 2, there is formed a metal collector electrode 17.

In the N− type drift region 20 on the front surface 1a (first main surface) side of the semiconductor chip 2 in the active section 40aa of the linear active cell region 40a (in the front surface side semiconductor region of the semiconductor substrate), the N type hole barrier region 24, the P type body region 15, and the N+ type emitter region 12 are arranged sequentially from the bottom. On the other hand, in the N− type drift region 20 on the front surface 1a (first main surface) side of the semiconductor chip 2 in the inactive section 40ai of the linear active cell region 40a (the front surface side semiconductor region of the semiconductor substrate), the N type hole barrier region 24, the P type body region 15, the P+ type buried body contact region 55, and the P+ type body contact region 25 are arranged sequentially from the bottom. Similarly to above, over the front surface 1a of the semiconductor chip 2, there is formed the contact trench 11 (or a contact hole). The N+ type emitter region 12 and the P+ type body contact region 25 are coupled via the contact trench 11 and the like to the metal emitter electrode 8.

Herein, in order to more specifically show the device structure, there will be shown examples of the main dimensions and main parameters of each part of the device (see FIGS. 2 and 4). Namely, the width Wa of the linear active cell region is about 1.0 micrometer, and the width Wi of the linear inactive cell region is about 2.5 micrometers (the width Wa of the linear active cell region is desirably narrower than the width Wi of the linear inactive cell region, and the value of "Wi/Wa" is in particular preferably within the range of, for example, 2 to 3). The contact width is about 1.0 micrometer; the trench width is about 0.7 micrometer (in particular preferably 0.8 micrometer or less); the trench depth is about 3 micrometers; the depth of the N+ type emitter region 12 is about 0.6 micrometer; and the depth of the P type body region 15 (channel region) is about 1.2 micrometers. The depth of the P type floating region 16 is about 4.5 micrometers; the thickness of the N type field stop region 19 is about 1.5 micrometers; the thickness of the P+ type collector region is about 0.5 micrometer; and the thickness of the semiconductor substrate 2 is about 120 micrometers (herein, an example of a breakdown voltage of about 1200 volts is shown). Incidentally, the thickness of the semiconductor substrate 2 highly depends upon the breakdown voltage. Therefore, with a breakdown voltage of 600 volts, the thickness is, for example, about 70 micrometers. With a breakdown voltage of 400 volts, the thickness is, for example, about 40 micrometers. Further, the recess depth in the top surface of the trench gate electrode 14 is, for example, about 0.4 micrometer, and the distance between the opposite-side trenches in the linear active cell region 40a (the distance between the inner sides of the trenches) is, for example, about 0.3 micrometer. The thickness of the P+ type body contact region 25 is, for example, about 0.4 micrometer; and the thickness of the P+ type buried body contact region is, for example, about 0.5 micrometer. The width of the active section 40aa in the linear active cell region 40a is, for example, about 0.4 micrometer. Although the width of the inactive section 40ai highly depends upon the value of the required saturation current, it is, for example, about 10 micrometers. Whereas, the resistivity of the N− type drift region 20 is, for example, about 70 Ωcm.

The width of the active section 40aa is preferably 0.5 micrometer or less. In this case, the running distance of the hole passing through the P type body region 15 under the N+ type emitter region 12 is estimated as 0.25 micrometer or less, and is at an unproblematic level in view of the latch-up resistance.

Incidentally, also in the following examples and the examples of Section 1, the dimensions of respective corresponding portions are roughly the same as those herein shown, and hence a description thereon will not be repeated.

3. Explanation of Main Manufacturing Process Corresponding to Manufacturing Method of the Narrow Active Cell IE Type Trench Gate IGBT of the One Embodiment of the Present Invention (Mainly FIGS. 10 to 24)

In this section, there will be shown one example of the manufacturing method of the device structure described in Section 2. Below, a description will be mainly given to the cell region 10. However, for the peripheral parts and the like, if required, a reference will be made to FIG. 1, 2, 4, or the like.

Figure 10:
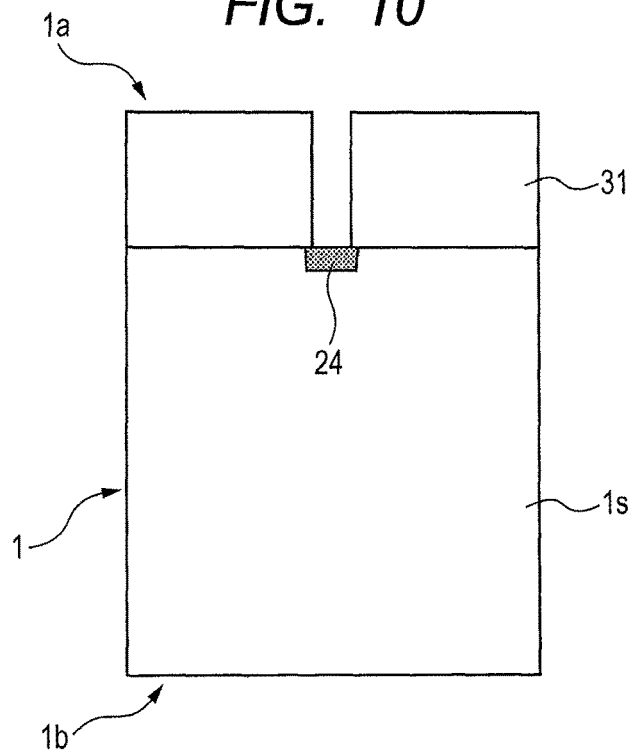
FIG. 10 is a device cross-sectional view in a manufacturing step (hole barrier region introduction step) corresponding to FIG. 7 for illustrating a manufacturing method corresponding to the device structure of the one embodiment of the present invention.
Figure 11:
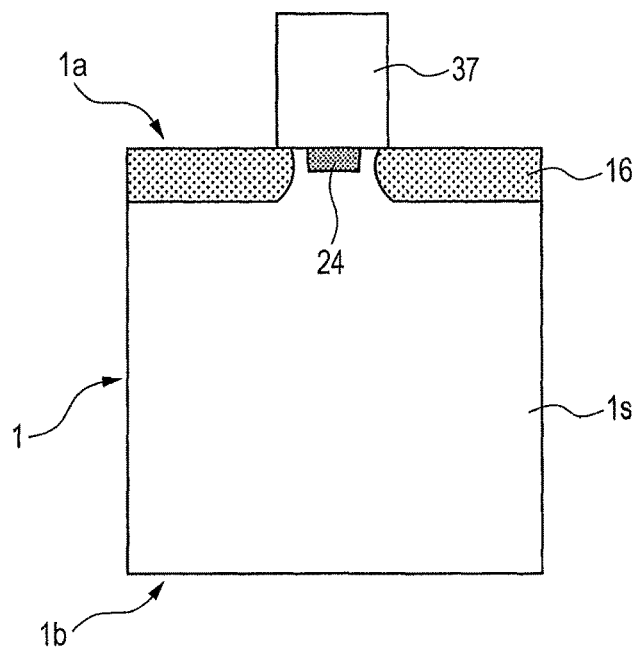
FIG. 11 is a device cross-sectional view in a manufacturing step (P type floating region introduction step) corresponding to FIG. 7 for illustrating a manufacturing method corresponding to the device structure of the one embodiment of the present invention.
Figure 12:
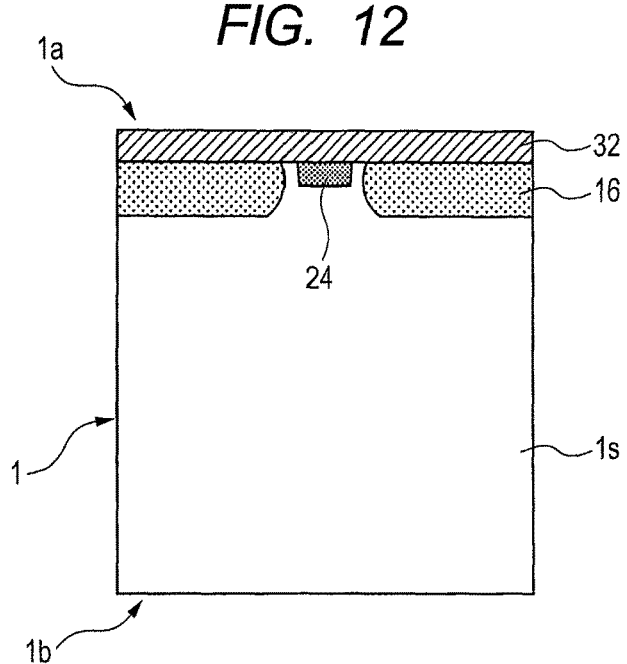
FIG. 12 is a device cross-sectional view in a manufacturing step (trench processing hard mask deposition step) corresponding to FIG. 7 for illustrating a manufacturing method corresponding to the device structure of the one embodiment of the present invention.
Figure 13:
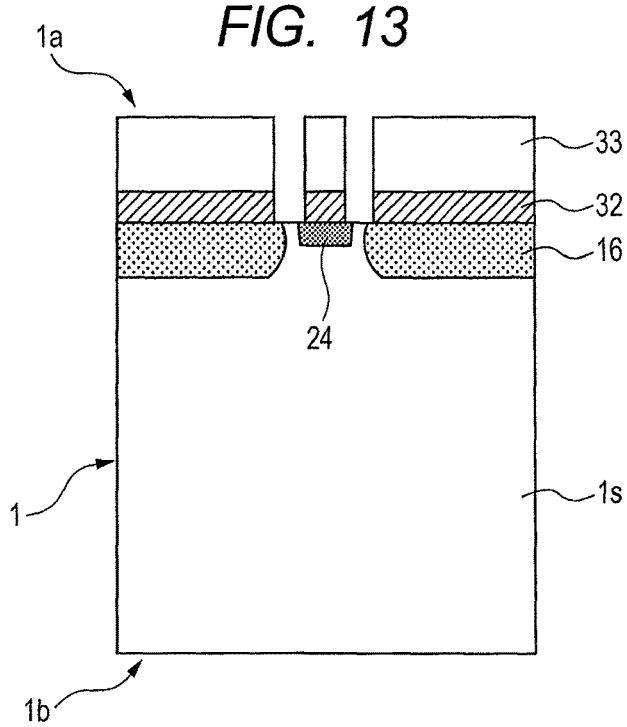
FIG. 13 is a device cross-sectional view in a manufacturing step (trench hard mask processing step) corresponding to FIG. 7 for illustrating a manufacturing method corresponding to the device structure of the one embodiment of the present invention.
Figure 14:
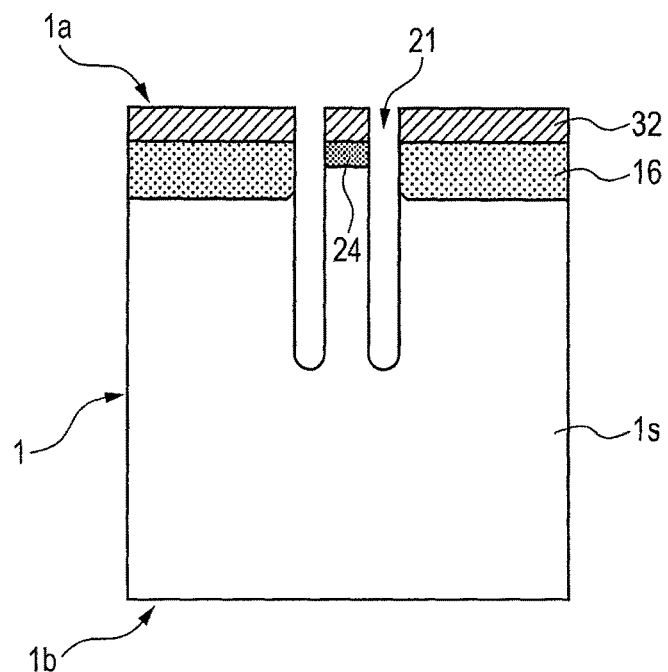
FIG. 14 is a device cross-sectional view in a manufacturing step (trench processing step) corresponding to FIG. 7 for illustrating a manufacturing method corresponding to the device structure of the one embodiment of the present invention.

FIG. 10 is a device cross-sectional view in a manufacturing step (hole barrier region introduction step) corresponding to FIG. 7 for illustrating a manufacturing method corresponding to the device structure of the one embodiment of the present invention. FIG. 11 is a device cross-sectional view in a manufacturing step (P type floating region introduction step) corresponding to FIG. 7 for illustrating a manufacturing method corresponding to the device structure of the one embodiment of the present invention. FIG. 12 is a device cross-sectional view in a manufacturing step (trench processing hard mask deposition step) corresponding to FIG. 7 for illustrating a manufacturing method corresponding to the device structure of the one embodiment of the present invention. FIG. 13 is a device cross-sectional view in a manufacturing step (trench hard mask processing step) corresponding to FIG. 7 for illustrating a manufacturing method corresponding to the device structure of the one embodiment of the present invention. FIG. 14 is a device cross-sectional view in a manufacturing step (trench processing step) corresponding to FIG. 7 for illustrating a manufacturing method corresponding to the device structure of the one embodiment of the present invention. FIG. 15 is a device cross-sectional view in a manufacturing step (trench processing hard mask removing step) corresponding to FIG. 7 for illustrating a manufacturing method corresponding to the device structure of the one embodiment of the present invention. FIG. 16 is a device cross-sectional view in a manufacturing step (drive-in diffusion and gate oxidation step) corresponding to FIG. 7 for illustrating a manufacturing method corresponding to the device structure of the one embodiment of the present invention. FIG. 17 is a device cross-sectional view in a manufacturing step (gate polysilicon etching back step) corresponding to FIG. 7 for illustrating a manufacturing method corresponding to the device structure of the one embodiment of the present invention. FIG. 18 is a device cross-sectional view in a manufacturing step (P type body region and N+ type emitter region introduction step) corresponding to FIG. 7 for illustrating a manufacturing method corresponding to the device structure of the one embodiment of the present invention. FIG. 19 is a device cross-sectional view in a manufacturing step (P+ type body contact region and P+ type buried body contact region introduction step) corresponding to FIG. 8 for illustrating a manufacturing method corresponding to the device structure of the one embodiment of the present invention. FIG. 20 is a device cross-sectional view in a manufacturing step (interlayer insulation film deposition step) corresponding to FIG. 7 for illustrating a manufacturing method corresponding to the device structure of the one embodiment of the present invention. FIG. 21 is a device cross-sectional view in a manufacturing step (contact hole formation step) corresponding to FIG. 7 for illustrating a manufacturing method corresponding to the device structure of the one embodiment of the present invention. FIG. 22 is a device cross-sectional view in a manufacturing step (surface metal deposition step) corresponding to FIG. 7 for illustrating a manufacturing method corresponding to the device structure of the one embodiment of the present invention. FIG. 23 is a device cross-sectional view in a manufacturing step (back surface girding and back surface impurity introduction step) corresponding to FIG. 7 for illustrating a manufacturing method corresponding to the device structure of the one embodiment of the present invention. FIG. 24 is a device cross-sectional view in a manufacturing step (back surface metal electrode formation step) corresponding to FIG. 7 for illustrating a manufacturing method corresponding to the device structure of the one embodiment of the present invention. Based on these, a description will be give to the main manufacturing process corresponding to the method for manufacturing the narrow active cell IE type trench gate IGBT of the one embodiment of the present invention.

First, there is prepared a 200-diameter wafer (which may be each wafer with various diameters such as a diameter of 150, a diameter of 100, a diameter of 300, and a diameter of 450) of N− type silicon single crystal (e.g., phosphorus concentration: about $2\times10^{14}/cm^3$). Herein, for example, a wafer by a FZ (Floating Zone) method is most preferable. However, a wafer by a CZ (Czochralski) method is also acceptable. This is because the wafer by the FZ method more readily provides a high-resistance wafer with a relatively higher quality, and more stable concentration. On the other hand, annealing of a CZ crystal at around 450 degrees centigrade generates thermal donors. This unfavorably results in an increase in substantial N type impurity capacity. Therefore, in this case, among the CZ crystals, those by the MCZ (Magnetic Field Applied CZ) method, having a relatively lower oxygen concentration are preferably used. Among the MCZ crystals, the crystals by, particularly, the HMCZ (Horizontal MCZ) method, the CMCZ (Cusp MCZ) method, and the like are particularly preferable. The oxygen concentration of the low oxygen MCZ crystal is generally about from $3\times10^{17}/cm^3$ to $7\times10^{17}/cm^3$. In contrast, the oxygen concentration of the FZ (Floating Zone) crystal is generally about $1\times10^{16}/cm^3$, and the oxygen concentration of a general CZ crystal not using the magnetic field is generally about $1\times10^{18}/cm^3$.

For the IE type trench gate IGBT of each embodiment of the present invention, even the crystals by the CZ method enables device design commonly allowable as a product. This is due to the following: for the IGBT enhanced in IE effect, the overall hole distribution is relatively flat in the ON state for the front surface-side hole accumulation effect; accordingly, even when a variation is caused in crystal resistivity, the effect exerted on the switching loss is small. Incidentally, the range of the resistivity of the high resistance CZ crystal particularly suitable to an IGBT is the range from about 20 Ωcm to about 85 Ωcm, for example, when the breakdown voltage is assumed to be within the range of from about 600 volts to 1200 volts.

Herein, in the IGBT, use of the CZ crystal has a merit of high mechanical strength and high thermal distortion resistance as distinct from the FZ crystal low in oxygen concentration. Further, as compared with the FZ crystal, the CZ crystal also has a merit of relative ease in increase in diameter of the wafer. Further, with an increase in diameter, the importance of the problem of the thermal stress increases. Accordingly, use of the CZ crystal is more advantageous from the viewpoint of the countermeasure against thermal stress. Application of the structure of the present invention enables the FZ crystal and the CZ crystal to be used properly according to the situation.

Then, as shown in FIG. 10, almost entirely over the front surface 1a (first main surface) of the semiconductor wafer 1, an N type hole barrier region introducing resist film 31 is formed by coating or the like, and is patterned by general lithography. Using the patterned N type hole barrier region introducing resist film 31 as a mask, for example, by ion implantation, N type impurities are introduced into a semiconductor substrate is (N− type single crystal silicon substrate) on the front surface 1a (first main surface) side of the semiconductor wafer 1, thereby to form an N type hole barrier region 24. As the ion implantation conditions at this step, the following can be shown as preferable ones: for example, ion species: phosphorus, dose amount: about $6\times10^{12}/cm^2$, and implantation energy: about 80 KeV. Then, the resist film 31 which has become unnecessary is removed by asking or the like. Thus, the introduction of the N type hole barrier region 24 before the formation of the trench is advantageous for controlling the depth and the expansion in the lateral direction.

Then, as shown in FIG. 11, almost entirely over the front surface 1a of the semiconductor wafer 1, a P type floating region introducing resist film 37 is formed by coating or the like, and is patterned by general lithography. Using the patterned P type floating region introducing resist film 37 as a mask, for example, by ion implantation, P type impurities are introduced into the semiconductor substrate is on the front surface 1a (first main surface) side of the semiconductor wafer 1, thereby to form a P type floating region 16. As the ion implantation conditions at this step, the following can be shown as preferable ones: for example, ion species: boron, dose amount: about $3.5\times10^{13}/cm^2$, and implantation energy: about 75 KeV. Then, the resist film 37 which has become unnecessary is removed by asking or the like. Then, if required, activation annealing or the like is carried out (e.g., 900 degrees centigrade, about 30 minutes). Incidentally, at the time of introduction of the P type floating region 16, the cell peripheral junction region 35 and the floating field ring 36 of FIG. 2 are also simultaneously introduced. Thus, the introduction of the P type floating region 16 before the formation of the trench is advantageous for controlling the depth and the expansion in the lateral direction. Incidentally, it is naturally understood that the timings of introduction of the N type hole barrier region 24 and the P type floating region 16 are reversible.

Then, as shown in FIG. 12, almost entirely over the front surface 1a of the semiconductor wafer 1, for example, by CVD (Chemical Vapor Deposition), there is deposited a trench forming hard mask film 32 such as a silicon oxide type insulation film (e.g., with a thickness of about 450 nm).

Then, as shown in FIG. 13, almost entirely over the front surface 1a of the semiconductor wafer 1, a trench hard mask film processing resist film 33 is formed by coating or the like, and is patterned by general lithography. Using the patterned trench hard mask film processing resist film 33 as a mask, for example, by dry etching, the trench forming hard mask film 32 is patterned. Then, the resist film 33 which has become unnecessary is removed by asking or the like.

Then, as shown in FIG. 14, using the patterned trench forming hard mask film 32, for example, a trench 21 is formed by anisotropic dry etching. As the gas type for the anisotropic dry etching, for example, $Cl_2/O_2$ type gases can be shown as preferable ones.

Then, as shown in FIG. 15, by wet etching using, for example, a hydrofluoric acid type silicon oxide film etchant, there is removed the trench forming hard mask film 32 which has become unnecessary.

Then, as shown in FIG. 16, the P type floating region 16 and the N type hole barrier region 24 are subjected to drive-in diffusion (e.g., 1200 degrees centigrade, about 30 minutes). Thus, after the formation of the trench, the P type floating region 16 and the N type hole barrier region 24 are subjected to drive-in diffusion. This is advantageous for controlling the depth, and the expansion in the lateral direction.

Subsequently, for example, by thermal oxidation or CVD, or both thereof, almost entirely over the front surface 1a of the semiconductor wafer 1 and the inner surface of the trench 21, there is formed a gate insulation film 22 (e.g., a thickness of about 120 nm).

Then, as shown in FIG. 17, a doped poly-silicon film 27 doped with phosphorus (e.g., a thickness of about 600 nm) is deposited in such a manner as to fill the trench 21 almost entirely over the front surface 1a of the semiconductor wafer 1 over the gate insulation film 22 and the inner surface of the trench 21 by, for example, CVD. Then, for example, by dry etching (e.g., gas type being $SF_6$), the polysilicon film 27 is etched back, thereby to form a trench gate electrode 14 in the trench 21.

Then, as shown in FIG. 18, over the front surface 1a of the semiconductor wafer 1, a P type body region introducing resist film 38 is formed by general lithography. Using the P type body region introducing resist film 38 as a mask, for example, by ion implantation, P type impurities are introduced into almost the entire surface of the cell region 10, and other necessary portions, thereby to form a P type body region 15. As the ion implantation conditions at this step, the following can be shown as preferable ones: for example, ion species: boron, dose amount: about $2\times10^{13}/cm^2$, and implantation energy: about 250 KeV. Then, the P type body region introducing resist film 38 which has become unnecessary is removed by asking or the like. Then, the P type body region 15 is subjected to drive-in diffusion (e.g., 1000 degrees centigrade, about 100 minutes). Incidentally, after drive-in diffusion of the P type floating region 16 and the N type hole barrier region 24, the P type body region 15 is introduced. This is effective for control of the profile and the like.

Then, over the front surface 1a of the semiconductor wafer 1, an N+ type emitter region introducing resist film 39 is formed by general lithography. Using the N+ type emitter region introducing resist film 39 as a mask, for example, by ion implantation, N type impurities are introduced into almost the entire surface of the top surface of the P type body region 15 in the active section 40aa of the linear active cell region 40a, thereby to form the N+ type emitter region 12. In terms of the feature of the structure of the present invention, the trench gate electrode 14 front surface is recessed to a slightly deep position (e.g., about 0.40 micrometer) from the front surface. Accordingly, the N+ type emitter region 12 is also required to be formed to a relatively deeper position correspondingly. As the ion implantation conditions at this step, the following two-stage ion implantation can be shown as the preferable one: for example, ion species: phosphorus, dose amount: about $1\times10^{14}/cm^2$, and implantation energy: about 175 KeV, and in addition to these, ion species: arsenic, dose amount: about $5\times10^{15}/cm^2$, and implantation energy: about 80 KeV. Then, the N+ type emitter region introducing resist film 39 which has become unnecessary is removed by ashing or the like.

Then, as shown in FIG. 19, over the front surface 1a of the semiconductor wafer 1, an introducing resist film 56 such as a P+ type body contact region is formed by general lithography. Using the P+ type body contact region, etc., introducing resist film 56 as a mask, for example, by ion implantation, P type impurities are introduced into almost the entire surface of the top surface of the P type body region 15 in the inactive section 40ai of the linear active cell region 40a, thereby to form a P+ type body contact region 25. As the ion implantation conditions at this step, the following can be shown as the preferable ones: for example, ion species: $BF_2$, dose amount: about $5\times10^{15}/cm^2$, and implantation energy: about 80 KeV.

Then, using the P+ type body contact region, etc., introducing resist film 56 as a mask, for example, by ion implantation, P type impurities are introduced into almost the entire surface of the top surface of the P type body region 15 in the inactive section 40ai of the linear active cell region 40a, thereby to form a P+ type buried body contact region 55. As the ion implantation conditions at this step, the following can be shown as the preferable ones: for example, ion species: boron, dose amount: about $3\times10^{15}/cm^2$, and implantation energy: about 80 KeV. Then, the P+ type body contact region, etc., introducing resist film 56 which has become unnecessary is removed by ashing or the like. Still thereafter, the N+ type emitter region 12, the P+ type body contact region 25, and the P+ type buried body contact region 55 are subjected to activation annealing (e.g., 950 degrees centigrade, about 60 minutes). Incidentally, it is naturally understood that the order of introduction of the N+ type emitter region 12, the P+ type body contact region 25, and the P+ type buried body contact region 55 can be replaced with each other. The introduction of the N+ type emitter region 12, the P+ type body contact region 25, and the P+ type buried body contact region 55 is carried out after drive-in diffusion of the P type body region 15. This is effective for controlling the profiles thereof. Further, the P+ type buried body contact region 55 is not essential. However, the presence of the P+ type buried body contact region 55 is effective for the improvement of the latch-up resistance. Further, the P+ type body contact region 25 and the P+ type buried body contact region 55 can also be formed by one-time ion implantation. However, two-stage ion implantation controls the concentration distribution more simply, and hence is particularly suitable for the improvement of the latch-up resistance.

Then, as shown in FIG. 20, almost entirely over the front surface 1a of the semiconductor wafer 1, for example, by CVD, as an interlayer insulation film 26, there is deposited, for example, a PSG (phosphosilicate glass) film (the thickness is, for example, about 600 nm). Preferable examples of the material for the interlayer insulation film 26 may include, other than the PSG film, BPSG (borophosphosilicate glass) film, NSG (non-doped silicate glass) film, and SOG (spin-on-glass) film, or composite films thereof.

Then, as shown in FIG. 21, over the front surface 1a of the semiconductor wafer 1 over the interlayer insulation film 26, a contact trench forming resist film is formed by general lithography. Subsequently, for example, by anisotropic dry etching (gas type being, for example, $Ar/CHF_3/CF_4$), there is formed a contact trench 11 (or a contact hole). Then, the resist film which has become unnecessary is removed by asking or the like.

Then, as shown in FIG. 22, by sputtering or the like, for example, there is formed an aluminum type electrode film 8 (to be a metal emitter electrode 8). Specifically, for example, the following procedure is carried out. First, for example, by sputtering deposition, almost entirely over the front surface 1a of the semiconductor wafer 1, as a barrier metal film, there is formed a TiW film (e.g., a thickness of about 200 nm) (by a later heat treatment, a large portion of titanium in the TiW film moves to the silicon interface to form silicide, which contributes the improvement of the contact characteristics, but the process is complicated, and hence is not shown in the drawing).

Subsequently, for example, about 30-minute silicide annealing is carried out in a nitrogen atmosphere at about 650 degrees centigrade. Subsequently, almost entirely over the barrier metal film, an aluminum type metal film including aluminum as a main component (e.g., silicon added in an amount of several percent, and the balance being aluminum) (e.g., with a thickness of about 5 micrometers) is formed in such a manner as to fill the contact trench 11, for example, by sputtering deposition. Subsequently, by general lithography, the metal emitter electrode 8 including an aluminum type metal film and a barrier metal film is patterned (as the gas type for dry etching, for example, $Cl_2/BCl_3$). Further, as a final passivation film, for example, an organic film including polyimide as a main component (e.g., with a thickness of about 2.5 micrometers) is coated almost entirely over the device surface 1a of the wafer 1. By general lithography, the emitter pad 9, the gate pad 6, and the like of FIG. 5 are opened.

Then, the back surface 1b of the wafer 1 is subjected to a back grinding treatment (if required, chemical etching or the like for removing the damage of the back surface is also carried out). As a result, the original wafer thickness of, for example, about 800 micrometers (as the preferable range, about from 1000 to 450 micrometers) is, if required, reduced to, for example, about 200 to 30 micrometers. For example, when the breakdown voltage is assumed to be about 1200 volts, the final thickness is about 120 micrometers.

Then, as shown in FIG. 23, N type impurities are introduced into almost the entire surface of the back surface 1b of the semiconductor wafer 1, for example, by ion implantation, thereby to form an N type field stop region 19. Herein, as the ion implantation conditions, the following can be shown as the preferable ones: for example, ion species: phosphorus, dose amount: about $7 \times 10^{12}/cm^2$, and implantation energy: about 350 KeV. Then, if required, for impurity activation, the back surface 1b of the wafer 1 is subjected to laser annealing or the like. Then, N type impurities are introduced into almost the entire surface of the back surface 1b of the semiconductor wafer 1, for example, by ion implantation, thereby to form a P+ type collector region 18. Herein, as the ion implantation conditions, the following can be shown as the preferable ones: for example, ion species: boron, dose amount: about $1 \times 10^{13}/cm^2$, and implantation energy: about 40 KeV. Then, if required, for impurity activation, the back surface 1b of the wafer 1 is subjected to laser annealing or the like. Herein, for the activation annealing of back surface ion implantation, the laser annealing conditions are optimized. As a result, the crystal defects generated by the back surface ion implantation at the portion in proximity to the boundary between the N type field stop region 19 and the N− type drift region 20 can be intentionally allowed to remain. The remaining crystal defects function as a local lifetime control layer, and contributes to the improvement of the trade-off characteristics of switching performance-ON voltage. Herein, as the annealing conditions (laser application conditions), the following can be shown as the preferable ones: for example, annealing method: laser is applied from the back surface 1b side of the wafer 1, wavelength: 527 nm, pulse width: about 100 ns, energy density: about 1.8 $J/cm^2$, application system: 2-pulse system, delay time between both pulses: about 500 ns, and pulse overlap ratio: about 66%.

Then, as shown in FIG. 24, for example, by sputtering deposition, a metal collector electrode 17 is formed over almost the entire surface of the back surface 1b of the semiconductor wafer 1 (for specific details, see FIG. 25 and its explanation). Then, by dicing or the like, division into the chip regions of the semiconductor wafer 1 is performed, and, if required, sealing in a package is performed, resulting in the completion of the device.

4. Detailed Description on Back Surface Side Device Structure of the Narrow Active Cell IE Type Trench Gate IGBT of the One Embodiment of the Present Invention, or Explanation of Modified Example (Aluminum-Doped Structure) (Mainly FIG. 25)

The examples described in this section relate to the back surface side structure of the semiconductor substrate. However, other examples than those in this section all relate to the front surface side structure of the semiconductor substrate. Therefore, the examples of this section are applicable to all other examples than those in this section. Further, it is naturally understood that they are also applicable to IGBTs having other general front surface side structure, and the like.

In this section, for convenience of description, the device structure will be described in accordance with the example of Section 2. As for the process, a brief description will be given by reference to Section 3.

Incidentally, below, the IE type trench gate IGBT will be specifically described. It is naturally understood that the back surface structure is not limited to the IE type IGBT and the trench gate IGBT, but is also applicable to IGBTs in other forms, and the like.

FIG. 25 is a local detailed cross-sectional view of the device back surface for a detailed description on the back surface side device structure of the narrow active cell IE type trench gate IGBT of the one embodiment of the present invention, or for illustrating the device structure and the manufacturing method of a modified example (aluminum-doped structure). Based on this, an explanation will be given to the detailed description on the back surface side device structure of the narrow active cell IE type trench gate IGBT of the one embodiment of the present invention or a modified example (aluminum-doped structure).

FIG. 25 shows a cross-sectional enlarged view of the back side and its vicinity of the semiconductor chip 2 of FIG. 7 (a schematic view of the structure in the vicinity of the back side enlarged in the thickness direction of the chip). As shown in FIG. 25, in the semiconductor region at the bottom end of the P+ type collector region 18 on the back surface side of the semiconductor substrate 2, there is arranged a relatively thin P type semiconductor region (with a thickness of, for example, about 0.04 to 0.1 micrometer), namely, an aluminum doped region 30. The impurity concentration (e.g., about $1 \times 10^{19}/cm^3$) is higher than the impurity concentration of the P+ type collector region 18. A metal collector electrode 17 is formed in contact with the aluminum doped region 30 over the back surface 1b of the semiconductor substrate 2. One example thereof will be shown as the following configuration from the side closer to the semiconductor substrate 2. Namely, there are an aluminum back surface metal film 17a (e.g., with a thickness of about 600 nm) which is an impurity source of the aluminum doped region 30, a titanium back surface metal film 17b (e.g., with a thickness of about 100 nm), a nickel back surface metal film 17c (e.g., with a thickness of about 600 nm), and a gold back surface metal film 17d (e.g., with a thickness of about 100 nm).

Then, the manufacturing method will be described briefly. In the process of FIG. 24 in Section 3, namely, during sputtering deposition, the aluminum back surface metal film 17a, the titanium back surface metal film 17b, the nickel back surface metal film 17c, and the gold back surface metal film 17d are sequentially subjected to sputtering deposition.

By the heat generated at this step, aluminum is introduced into the silicon substrate, thereby to form the aluminum doped region 30. Then, by dicing or the like, division into chip regions of the semiconductor wafer 1 is performed, resulting in the state as shown in FIG. 7 (FIG. 7 does not clearly show the detailed structure).

In each embodiment of the present invention, there is adopted a structure in which, in the ON state, holes are accumulated on the emitter side to promote the injection of electrons. On the other hand, for the PN diode on the back surface collector side, conversely, there is adopted a diode resulting in a low injection efficiency, thereby to achieve a lower switching loss. Namely, there is adopted a transparent emitter. Herein, in order to form the back surface diode with a low injection efficiency, it is effective to reduce the ratio of the carrier concentration "Qp" to the P+ type collector region 18 and the carrier concentration "Qn" of the N type field stop region 19 (which will be hereinafter referred to as a "carrier concentration ratio"), namely, "(Qp/Qn)". However, to that end, when the carrier concentration "Qp" of the P+ type collector region 18 is excessively reduced, the characteristics of the back surface metal contact are deteriorated. Thus, in this example, there is arranged the aluminum doped region 30 higher in impurity concentration than the P+ type collector region 18 introduced from the back-surface aluminum film. As the carrier concentration ratio, for example, about 1.5 (the range of, e.g, about 1.1 to 4) can be shown as the preferable one capable of optimizing the trade-off performance of switching performance-ON voltage performance. In each embodiment of the present invention, there is adopted a structure in which, in the ON state, holes are accumulated on the emitter side to promote the injection of electrons. At this step, electrons injected from the front surface side reach the back surface collector side, and promote injection of holes from the back surface PN diode. Further, the injected holes reach the front surface, and promote injection of electrons from the front surface side. When each embodiment of the present invention is employed, such a positive feedback phenomenon facilitates the occurrence of the conductivity modulation of the N-drift region 20. For this reason, it becomes possible to implement a device less likely to undergo an increase in ON voltage even when the PN diode on the back surface collector side has a specification resulting in lower injection efficiency. When the switching performance is regarded as important, the case where the "(Qp/Qn)" is set at 1 or less is also assumed. However, even in that case, the effect of the surface structure of the present invention can suppress a sharp increase in ON voltage.

5. Explanation of Modified Example 1 Regarding the Front Surface Side Device Structure of the Narrow Active Cell IE Type Trench Gate IGBT of the One Embodiment of the Present Invention (N+ Type Surface Floating Region & P+ Type Surface Floating Region Addition Structure) (Mainly FIGS. 26 to 28)

The example described in this section is, for example, a modified example of the planar layout of FIG. 6.

FIG. 26 is an enlarged top view corresponding to FIG. 6, for illustrating Modified Example 1 (N+ type surface floating region & P+ type surface floating region addition structure) regarding the surface side device structure of the narrow active cell IE type trench gate IGBT of the one embodiment of the present invention. FIG. 27 is a device cross-sectional view corresponding to a F-F' cross section of FIG. 26. FIG. 28 is a device cross-sectional view corresponding to a G-G' cross section of FIG. 26. Based on these, a description will be given to Modified Example 1 (N+ type surface floating region & P+ type surface floating region addition structure) regarding the surface side device structure of the narrow active cell IE type trench gate IGBT of the one embodiment of the present invention.

As shown in FIG. 26, as distinct from FIG. 6, not only in the linear active cell region 40a, but also in the portion of a linear inactive cell region 40i corresponding to the active section 40aa, there is arranged an N+ type surface floating region 12i (first conductivity type surface floating region) corresponding to the N+ type emitter region 12. Namely, the N+ type surface floating region 12i is formed in the same process as that for, for example, the N+ type emitter region 12, simultaneously. As a result, the linear inactive cell region 40i is divided into a first conductivity type floating region formation section in which the N+ type surface floating region 12i is formed in the length direction thereof, and a first conductivity type floating region non-formation section in which the N+ type surface floating region 12i is not formed.

Some of electrons injected from the MOSFET portion in the IGBT pass through the accumulation layer formed at the N type layer portion of the trench sidewall and the inversion layer formed at the P type sidewall portion, and also reach the N+ type surface floating region 12i, to be injected into the P type floating region 16. When the IGBT turns off in this state, the electrons recombine with holes remaining in the P type floating region 16 to be annihilated. As a result, it is possible to reduce the switching loss at the OFF time.

Further, similarly, as distinct from FIG. 6, not only in the linear active cell region 40a, but also in the portion of a linear inactive cell region 40i corresponding to the active section 40aa, there are arranged regions corresponding to the P+ type body contact region 12 and the P+ type buried body contact region 55. Namely, the regions are a P+ type surface floating region 25i (second conductivity type surface floating region) and a P+ type buried floating region 55i.

Therefore, the F-F' cross section of FIG. 26 is roughly equal to FIG. 7, except that as shown in FIG. 27, in the front surface 1a of the semiconductor substrate of the active section 40aa in the linear inactive cell region 40i, there is arranged the N+ type surface floating region 12i.

On the other hand, the G-G' cross section of FIG. 26 is equal to FIG. 8, except that as shown in FIG. 28, also in the front surface region of the P type body region 15 in the linear inactive cell region 40i, there are arranged a P+ type surface floating region 25i (second conductivity type surface floating region) and a P+ type buried floating region 55i corresponding to the P+ type body contact region 12 and the P+ type buried body contact region 55.

Such a structure has a merit of forming the N+ type emitter region introducing resist film 39 and the P+ type body contact region, etc., introducing resist film 56 in a relatively simple structure crossing the trench 21. Namely, the structure has a merit of increasing the process margin in that there is eliminated the necessity of allowing the ends of the resist film patterns to extend along the trench. Further, also for this case, the structure is not limited to fully crossing the linear inactive cell region 40i. It is also acceptable that the ends of the resist film patterns of the N+ type emitter region introducing resist film 39 and the P+ type body contact region, etc., introducing resist may be formed inside the linear inactive cell region 40i.

6. Explanation of Modified Example 2 Regarding the Front Surface Side Device Structure of the Narrow Active Cell IE Type Trench Gate IGBT of the One Embodiment of the Present Invention (Simplified Active Cell Structure) (Mainly FIG. 29)

The unit cell structure described in this section is the one obtained by omitting the P type floating region 16 and the N type hole barrier region 24 in the unit cell structure in FIG. 7.

FIG. 29 is a device cross-sectional view corresponding to the C-C' cross section of FIG. 6 corresponding to FIG. 7 for illustrating Modified Example 2 (simplified active cell structure) regarding the surface side device structure of the narrow active cell IE type trench gate IGBT of the one embodiment of the present invention. Based on this, a description will be given to Modified Example 2 (simplified active cell structure) regarding the front surface side device structure of the narrow active cell IE type trench gate IGBT of the one embodiment of the present invention.

As shown in FIG. 27, in this example, in the unit cell structure in FIG. 7, the P type floating region 16 and the N type hole barrier region 24 are omitted. Therefore, the hole concentration of the N− type drift region 20 portion of the linear active cell region 40a tends to be reduced as compared with the structure of FIG. 7. For example, when the linear active cell region 40a is sufficiently narrow, and when the depth of the trench 21 is sufficiently deep, it becomes effective to adopt the structure of FIG. 29. Namely, it is possible to simplify the device structure and the impurity doping step. Further, there is implemented a structure advantageous in the case not for use in which importance is placed on a low ON voltage, but for use in which the switching performance is desired to be made higher.

7. Explanation of Modified Example 3 Regarding the Front Surface Side Device Structure of the Narrow Active Cell IE Type Trench Gate IGBT of the One Embodiment of the Present Invention (Hole Collector Cell Addition Structure) (Mainly FIGS. 30 to 35)

The example described in this section is a modified example relative to the basic device structure (mainly FIG. 2) described in Section 1. Therefore, other views such as FIGS. 1, and 3 to 29 also apply to this example with corresponding changes added thereto, respectively, or as they are.

FIG. 30 is a device schematic cross-sectional view of the A-A' cross section of the cell region end cut-out region R1 of FIG. 1 corresponding to FIG. 2 for illustrating Modified Example 3 (hole collector cell addition structure) regarding the surface side device structure of the narrow active cell IE type trench gate IGBT of the one embodiment of the present invention. FIG. 31 is an enlarged top view of the linear unit cell region and its periphery R5 of FIG. 1 for illustrating Modified Example 3 (hole collector cell addition structure) regarding the surface side device structure of the narrow active cell IE type trench gate IGBT of the one embodiment of the present invention. FIG. 32 is an enlarged top view corresponding to FIG. 6 for illustrating Modified Example 3 (hole collector cell addition structure) regarding the surface side device structure of the narrow active cell IE type trench gate IGBT of the one embodiment of the present invention. FIG. 33 is a device cross-sectional view corresponding to a H-H' cross section of FIG. 32. FIG. 34 is a device cross-sectional view corresponding to a J-J' cross section of FIG. 32. FIG. 35 is a device cross-sectional view corresponding to a K-K' cross section of FIG. 32. Based on these, a description will be given to Modified Example 3 (hole collector cell addition structure) regarding the front surface side device structure of the narrow active cell IE type trench gate IGBT of the one embodiment of the present invention.

(1) Explanation of Narrow Active Cell Type Unit Cell and Alternate Array System (Mainly FIG. 30):

Then, FIG. 30 shows the X-X' cross section of the cell region end cut-out region R1 of FIG. 1. As shown in FIG. 30, in the semiconductor region (in this example, silicon single crystal region) of the back surface 1b (the back side main surface or the second main surface of the semiconductor substrate) of the chip 2, there is arranged the P+ type collector region 18. Over the front surface, there is arranged the metal collector electrode 17. Between the N− type drift region 20 (first conductivity type drift region) and the P+ type collector region 18 forming the main part of the semiconductor substrate 2, there is arranged the N type field stop region 19.

On the other hand, in the semiconductor region on the front surface side 1a of the N− type drift region 20 (the front side main surface or the first main surface of the semiconductor substrate), there are arranged a large number of trenches 21. Therein, trench gate electrodes 14 are embedded via the gate insulation film 22, respectively. Each trench gate electrode 14 is coupled to the metal gate electrode 5 (specifically, the metal gate wire 7) or the emitter electrode 8 according to its function.

Further, the trenches 21 perform a function of defining respective regions. For example, a dummy cell region 34 is defined from opposite sides thereof by a pair of trenches 21. One trench 21 of these defines the cell region 10 and the cell peripheral junction region 35. The cell peripheral junction region 35 is coupled via a P+ type body contact region 25p to the metal emitter electrode 8. Incidentally, in the present invention, unless otherwise specified, the thickness of the gate insulation film 22 at any portion of the trench is assumed to be roughly equal (however, it is not excluded that, if required, a given portion is different in thickness from other portions). Thus, in the cell peripheral junction region 35 and the dummy cell region 34, an emitter contact is established. As a result, even when the width of the dummy cell region 34 or the like is changed in view of process, it is possible to prevent the reduction of the breakdown voltage.

In the semiconductor region on the front surface side 1a of the N− type drift region 20 outside the cell peripheral junction region 35, there is arranged a P type floating field ring 36. Over the front surface 1a, a field plate 4 is arranged, and is coupled via a P+ type body contact region 25r to the floating field ring 36.

Then, the cell region 10 will be further described. The dummy cell region 34 is basically equal in both structure and size to the linear active cell region 40a except for not having an N+ type emitter region 12. A P+ type body contact region 25d arranged in the front surface of the P type body region 15 is coupled to the metal emitter electrode 8. Further, the dummy cell region 34 can be basically formed in the same structure as that of the hole collector cell (see FIG. 30).

Most of the inside region of the cell region 10 basically has a repeating structure of translational symmetry with the linear unit cell region 40 as a unit cell (incidentally, symmetry in a strict sense is not required. The same shall apply hereinafter). The linear unit cell region 40 as the unit cell includes a linear inactive cell region 40i, a linear active cell region 40a on one side thereof, a linear hole collector cell region 40c on the other side thereof, and, half-width linear inactive cell regions 40i on opposite sides thereof. However, specifically, it can be seen that the linear active cell regions 40a and the linear hole collector cell regions 40c are alternately arranged between the full-width linear inactive cell regions 40i (see FIG. 31). Alternatively, it can also be seen that first linear unit cell regions 40f and second linear unit cell regions 40s are alternately arrayed.

In the semiconductor surface region on the front side main surface 1a (first main surface) side of the semiconductor substrate of the linear active cell region 40a, there is arranged the P type body region 15 (second conductivity type body region). In the front surface thereof, there are arranged an N+ type emitter region 12 (first conductivity type emitter region) and a P+ type body contact region 25. The N+ type emitter region 12 and the P+ type body contact region 25 are coupled to the metal emitter electrode 8. In the linear active cell region 40a, in the N– type drift region 20 under the P type body region 15, there is arranged an N type hole barrier region 24. Incidentally, the trench gate electrodes 14 on the opposite sides of the linear active cell region 40a are electrically coupled to the metal gate electrode 5.

In contrast, the structure of the linear hole collector cell region 40c is different in this example only in that there is no N+ type emitter region 12, and in that the trench gate electrodes 14 on the opposite sides thereof are coupled to the emitter electrode 8, and, is equal in other respects including dimensions and the like to the linear active cell region 40a.

On the other hand, in the front side main surface 1a (first main surface) side semiconductor surface region of the semiconductor substrate in the linear inactive cell region 40i, similarly, the P type body region 15 is arranged. In the underlying N– type drift region 20, there is arranged a P type floating region 16 (second conductivity type floating region) covering the lower ends of the trenches 21 on the opposite sides, and deeper than them. By arranging such a P type floating region 16, it is possible to widen the width Wi of the linear inactive cell region without causing a sharp reduction of the breakdown voltage. For example, even when the layout is adjusted in order to optimize the characteristics such as the gate capacity and ON voltage, there is no fear of the reduction of the breakdown voltage, and the degree of freedom for design can be ensured. Further, for example, when the concentration of the N type hole barrier region 24 is increased for optimization, similarly, there is no effect on the breakdown voltage. As a result of this, it becomes possible to effectively enhance the hole accumulation effect. Incidentally, in the IE type trench gate IGBT, there is not formed a contact from the emitter electrode 8 to the P type floating region 16. This is as follows: the direct hole discharge path from the P type floating region 16 to the emitter electrode 8 is blocked, which results in an increase in hole concentration of the N– type drift region 20 (N base region) under the linear active cell region 40a; as a result, the electron concentration to be injected from the MOSFET into the N base region in the IGBT is improved, thereby to reduce the ON resistance.

In this example, the width Wa of the linear active cell region 40a and the width Wc of the linear hole collector cell region 40c are set narrower than the width Wi of the linear inactive cell region 40i. In the present invention, this is referred to as a "narrow active cell type unit cell". Below, mainly, a device having the narrow active cell type unit cell will be specifically described. However, the example herein described is not limited thereto. It is naturally understood that the example is also applicable to a device having a "non-narrow active cell type unit cell".

In the example of FIG. 30, the linear active cell regions 40a (or the linear hole collector cell regions 40c) and the linear inactive cell regions 40i are alternately arrayed to form the linear unit cell region 40. This configuration is referred to as an "alternate array system" in the present invention. Below, unless otherwise specified, a description will be given on the premise of the alternate array system. However, it is naturally understood that the "non-alternate array system" is also acceptable.

In FIG. 30, a description was given to the outline of embodiments of FIGS. 31 to 35 of the present invention (the main part and the peripheral part). However, in the following description, these are divided into structural elements such as a cell part (cross-sectional or planar structure), and a cell peripheral part to be described. However, it is naturally understood that these also provides the outlines to various modified examples.

(2) Explanation of Active Cell Two-Dimensional Thinned-Out Structure (Mainly FIG. 31)

FIG. 31 shows one example of the detailed planar structure of the linear unit cell region main part and its peripheral cut-out region R5 of FIG. 1. As shown in FIG. 31, in the length direction of the linear active cell region 40a, for example, active sections 40aa having a given length are arranged at a given interval, between which there is an inactive section 40ai not including the N+ type emitter region 12 arranged therein. Namely, some portions in the length direction of the linear active cell region 40a locally and dispersively become the active sections 40aa. A further description will be given. In the active section 40aa of the linear active cell region 40a, in almost the entire region thereof, there is arranged the N+ type emitter region 12. In the inactive section 40ai of the linear active cell region 40a, in almost the entire region thereof, there are arranged the P+ type body contact region 25 and the P+ type buried body contact region 55. On the other hand, in the linear hole collector cell region 40c, in almost the entire region thereof, the P+ type body contact region 25 and the P+ type buried body contact region 55 are arranged, and the N+ emitter region 12 is not arranged. In the linear inactive cell region 40i, similarly to others, in almost the entire region thereof, there are arranged the P type body region 15 and the P type floating region 16 (second conductivity type floating region).

Incidentally, herein, "being distributed with a given length at a given interval" means "being periodical". However, "being substantially periodical" corresponds to the local and dispersive distribution. However, "being local and dispersive" is "being wider than that" and does not necessarily mean "being periodical or quasi-periodical".

(3) Detailed Description of Layout and Device Structure in which Active Cells are Alternately Replaced with Hole Collector Cells (Mainly FIGS. 32 to 35):

The structures of the linear active cell region 40a and the linear inactive cell region 40i are the same as those shown in FIGS. 4, and 6 to 9. Below, only the linear hole collector cell region 40c will be described.

As shown in FIG. 32, the trench buried electrodes 14c on the opposite sides of the linear hole collector cell region 40c are required to be coupled to the emitter potential. In this example, two (the trench buried electrodes 14c on the opposite sides) are coupled to each other via, for example, a buried electrode coupling part 28 of a polysilicon film at the same layer (including an intra-trench electrode 14i in the coupling part trench 21c). Over the buried electrode coupling part 28, there is arranged a contact part 11c (contact hole) between emitter electrode-buried electrode, via which, coupling is established with the metal emitter electrode 8. Then, the feature of the linear hole collector cell region 40c is similar to that of the linear active cell region 40a, but is different in that the N+ type emitter region 12 is not arranged, and in that the P+ type body contact region 25 and the P+ type buried body contact region 55 are arranged in almost the entire region except for the underlying part of the buried electrode coupling part 28.

Then, FIG. 33 shows the H-H' cross section of FIG. 32. As shown in FIG. 33, the cross section is similar to the cross section (linear active cell region 40a) of FIG. 7. However, in the cross section of the linear hole collector cell region 40c, there is the buried electrode coupling part 28 (polysilicon coupling part) in the overlying part. So the N+ type emitter region 12 and the P type body region 15 are not introduced. This is for the following reason: in the step of FIG. 17, the polysilicon film 27 over the linear hole collector cell region 40c is left; as a result, in the step of FIG. 18, impurities are not introduced under the buried electrode coupling part 28. This also applies to FIG. 34. Herein, the underlying part of the buried electrode coupling part 28 is in the floating state. If the P type diffusion layer is not present at all, in the OFF state, the electric field intensity concentrates to the trench bottom end, resulting in the reduction of the breakdown voltage. For this reason, into under the buried electrode coupling part 28, the P type floating region 16 is desirably introduced. The P type floating region 16 has been subjected to ion implantation at the step before the formation of the buried electrode, and hence can be arranged under the buried electrode coupling part 28. As a result, even if the linear inactive cell region 40i is set with any dimensions, the breakdown voltage can be ensured. This enables the design having the degree of freedom according to the product requirements.

Then, FIG. 34 shows the J-J' cross section of FIG. 32. As shown in FIG. 34, the cross section is basically similar to FIG. 9, but is different in that between the linear hole collector cell region 40c and the linear inactive cell region 40i, there are a coupling part trench 21c and a trench buried coupling part 14i. Further, the cross section is also different in that, for the same reason as the previous one, in the linear hole collector cell region 40c, there are no N+ type emitter region 12, no P+ type body contact region 25, and no P+ type buried body contact region 55. Further, the coupling part trench 21c efficiently separates the P type floating region 16 from the P+ type body contact region 25 and the P+ type buried body contact region 55 coupled to the metal emitter electrode 8.

Then, FIG. 35 shows the K-K' cross section of FIG. 32. As shown in FIG. 35, the cross section is entirely equal to FIG. 8, except that the trench gate electrode 14 is a trench buried electrode 14c coupled to the emitter potential.

The degree of the hole accumulation effect of the surface device structure depends upon the geometrical shape and the N type hole barrier region 24. In other words, the linear active cell region 40a and the linear hole collector cell region 40c do not cause a significant difference for holes. In other words, the hole accumulation effect is equal, and accordingly, the IE effect is also equal. Thus, by replacing some of a plurality of the linear active cell regions 40a with the linear hole collector cell regions 40c, respectively, it is possible to reduce the trenches functioning as a gate capacity with the hole accumulation effect still in the same state. In other words, it is possible to prevent an increase in gate capacity even when cell shrinkage is achieved to the utmost in order to enhance the IE effect.

Further, when some of the linear active cell regions 40a are replaced with the linear hole collector cell regions 40c, respectively, still in that state, the absolute amount of the N+ type emitter region 12 per unit area is reduced, resulting in a smaller saturation current value. However, when the length of the inactive section 40ai in the linear active cell region 40a is shortened, and the proportion occupied by the active section 40aa is increased and optimized, it is possible to keep the value of the saturation current required as an IGBT for invertors use. In the main embodiment of the present invention, the linear layout is basically adopted. Thus, the optimum design of the N+ type emitter region 12 is easy. Further, for the IGBT using the related-art technology, substantial cell shrinkage is implemented. For this reason, even when the linear hole collector cell region 40c is arranged, optimization of the layout in the linear active cell region 40a can ensure the saturation current required as the whole chip.

8. Supplementary Explanation on the Embodiment (Including Modified Examples) and Consideration on the Whole (Mainly FIG. 36)

FIG. 36 is an enlarged top view of the linear unit cell region and its periphery R5 of FIG. 1 for illustrating the outline of the device structure of the one embodiment of the present invention. Based on this, a description will be given to the supplementary explanation on the embodiment (including modified examples), and the consideration on the whole thereof.

In an IE type IGBT, an attempt to enhance the IE effect requires minimization of the interval between trenches. However, with a structure including substrate trenches for body contact (or substrate contact trench), it is necessary to ensure the width of the substrate contact trench. Thus, shrinkage is difficult. On the other hand, even a decrease in width of the trench itself does not lead to the improvement of the IE effect. Rather, in order to ensure the thickness of the gate insulation film or the like, the with of the trench itself is desirably not reduced.

Thus, in the each embodiment (including modified examples), as shown in FIG. 36, in the two-dimensional thinned-out structure, over almost the entire surface of the active section 40aa of the linear active cell region 40a, the N+ type emitter region 12 is spread, resulting in a structure including no P+ type body contact region 25.

Herein, from the viewpoint of ensuring the latch-up resistance, the width of the active section 40aa is desirably as small as possible (e.g., about 0.5 micrometer or less). Incidentally, when the area of the whole active sections 40aa is desired to be increased, preferably, the width of each individual active section 40aa is made as it is, and the pitch thereof is reduced (the number is increased). When the width f each individual active section 40aa is simply increased too much, not only the latch-up resistance is reduced, but also the short-circuit safe operating area is also reduced.

9. Summary

Up to this point, the invention made by the present inventors was specifically described by way of embodiments. However, the present invention is not limited thereto. It is naturally understood that various changes may be made within the scope not departing from the gist thereof.

For example, in the each embodiment, a specific description was given to the example using doped poly-silicon or the like as the gate polysilicon member. However, the present invention is not limited thereto. The following procedure is also acceptable: a nondoped poly-silicon film is applied thereto; after deposition, necessary impurities are added by ion implantation or the like.

Further, in the each embodiment, a description was given to the example in which using a non-epitaxial wafer, after back grinding, a high-concentration impurity layer was formed from the back surface. However, the present invention is not limited thereto. It is naturally understood that the present invention is also applicable to the one manufactured using an epitaxial wafer.

What is claimed is:

1. A narrow active cell IE type trench gate IGBT comprising:
   a silicon type semiconductor substrate having a first main surface and a second main surface;
   an IGBT cell region arranged on the first main surface side of the silicon type semiconductor substrate;
   a plurality of linear active cell regions, a plurality of linear inactive cell regions, and a plurality of linear hole collector regions, the linear active cell regions and the linear hole collector regions being alternately arranged between the linear inactive cell regions in a lateral direction in the IGBT cell region;
   a plurality of active sections and a plurality of inactive sections alternately arranged along a longitudinal direction in each of the linear active cell regions;
   a plurality of first trenches arranged in the first main surface of the silicon type semiconductor substrate, the first trenches being disposed at respective boundaries between each of the linear active cell regions, each of the linear inactive cell regions, and each of the linear hole collector regions, and the first trenches extending in the longitudinal direction;
   a plurality of first gate electrodes, the first gate electrodes being respectively arranged in the first trenches with an insulation film;
   an emitter region having a first conductivity type, arranged in a surface region on the first main surface side of the silicon type semiconductor substrate, and extending in each of the active sections between adjacent first trenches;
   a body contact region having a second conductivity type, arranged in the surface region on the first main surface side of the silicon type semiconductor substrate, extending in each of the inactive sections between adjacent first trenches, and extending in each of the linear hole collector regions between adjacent first trenches;
   a metal emitter electrode arranged over the first main surface of the silicon type semiconductor substrate, and electrically coupled to the emitter region and the body contact region;
   a plurality of second trenches arranged in the first main surface of the silicon type semiconductor substrate, the second trenches extending in the lateral direction in each of the linear hole collector regions between adjacent first trenches; and
   a plurality of second gate electrodes, the second gate electrodes being respectively arranged in the second trenches with the insulation film in each of the linear hole collector regions,
   wherein the first gate electrodes and the second gate electrodes define an intra-trench electrode in each of the linear hole collector regions,
   wherein the emitter region in each of the active sections extends in the longitudinal direction between adjacent first trenches to separate the body contact region in each of the inactive sections,
   wherein a floating region having the second conductivity type is arranged in the surface region on the first main surface side of the silicon type semiconductor substrate, extends in the lateral direction between the first gate electrodes of the intra-trench electrode in each of the linear hole collector regions, and extends in the longitudinal direction between the second gate electrodes of the intra-trench electrode in each of the linear hole collector regions,
   wherein the intra-trench electrode separates the floating region from the body contact region in each of the linear hole collector regions, and
   wherein a buried electrode coupling part couples the intra-trench electrode to the emitter electrode and is arranged over the floating region in each of the linear hole collector regions.

2. The narrow active cell IE type trench gate IGBT according to claim 1,
   wherein the body contact region is arranged over each of the inactive sections, and
   wherein the emitter region is arranged over each of the active sections to separate the active sections and the inactive sections.

3. The narrow active cell IE type trench gate IGBT according to claim 2, wherein the floating region is further arranged to extend in each of the linear inactive cell regions between bottom ends of the adjacent first trenches.

4. The narrow active cell IE type trench gate IGBT according to claim 3, further comprising:
   a hole barrier region having the first conductivity type, arranged in the surface region on the first main surface side of the silicon type semiconductor substrate, and extending in each of the linear active cell regions in the longitudinal direction and to a same level of depth as that of the bottom ends of the adjacent first trenches.

5. The narrow active cell IE type trench gate IGBT according to claim 4, further comprising:
   a buried body contact region having the second conductivity type, and arranged under the body contact region in such a manner as to be in contact therewith.

6. The narrow active cell IE type trench gate IGBT according to claim 5,
   wherein an interval between the adjacent first trenches on opposite sides of each of the linear active cell regions is 0.35 micrometer or less.

7. The narrow active cell IE type trench gate IGBT according to claim 6,
   wherein a width in the longitudinal direction of each of the active sections is 0.5 micrometer or less.

8. The narrow active cell IE type trench gate IGBT according to claim 7, further comprising:
   a first conductivity type surface floating region arranged in the surface region on the first main surface side of the silicon type semiconductor substrate, and extending in each of the linear inactive cell regions between the adjacent first trenches in a lateral direction at a same level of depth as, and corresponding to an extension in the lateral direction of, the emitter region in the active sections of the linear active cell regions.

9. The narrow active cell IE type trench gate IGBT according to claim 8, further comprising:
   a second conductivity type surface floating region arranged in the surface region on the first main surface side of the silicon type semiconductor substrate, and extending in each of the linear inactive cell regions between adjacent first trenches in a lateral direction at a same level of depth as, and corresponding to an extension in the lateral direction of, the body contact region in the linear active cell regions.

10. The narrow active cell IE type trench gate IGBT according to claim 7, further comprising:
    a drift region having the first conductivity type, arranged as a main part of the silicon type semiconductor substrate;

a field stop region arranged on the second main surface side of the drift region, having the first conductivity type, and having a higher dopant concentration than that of the drift region;

a collector region having the second conductivity type, arranged on the second main surface side of the field stop region;

an aluminum doped region arranged on the second main surface side of the collector region, and having a higher dopant concentration than that of the collector region; and a metal collector electrode arranged on the second main surface side of the aluminum doped region, wherein a portion of the metal collector electrode in contact with the aluminum doped region is a back surface metal film including aluminum as a main component.

11. The narrow active cell IE type trench gate IGBT according to claim 1, wherein the body contact region extends in each of the inactive sections between the emitter region of adjacent active sections in the longitudinal direction to separate the active sections and the inactive sections.

12. The narrow active cell IE type trench gate IGBT according to claim 1, wherein the emitter region extends in each of the active sections between the body contact region of adjacent inactive sections in the longitudinal direction to separate the active sections.

13. The narrow active cell IE type trench gate IGBT according to claim 1, further comprising:

a body region having the second conductivity type, arranged in the surface region on the first main surface side of the silicon type semiconductor substrate, extending in each of the linear active cell regions across the active sections and the inactive sections in the longitudinal direction, wherein the body region is in contact with the emitter region in each of the active sections, and wherein the body region is thicker in each of the active sections than in each of the inactive sections.

14. The narrow active cell IE type trench gate IGBT according to claim 1, further comprising:

a buried body contact region having the second conductivity type, arranged in the surface region on the first main surface side of the silicon type semiconductor substrate, and extending below the body contact region in each of the inactive sections in the longitudinal direction between adjacent first trenches, wherein a depth of the body contact region and the buried body contact region is larger than the emitter region.

15. The narrow active cell IE type trench gate IGBT according to claim 14, further comprising:

a buried body contact region having the second conductivity type, arranged in the surface region on the first main surface side of the silicon type semiconductor substrate, and extending in each of the inactive sections underneath the body contact region, wherein the body region is in contact with the buried body contact region in each of the inactive sections.

16. The narrow active cell IE type trench gate IGBT according to claim 1, wherein the emitter region in each of the active sections extends into the first main surface side of the silicon type semiconductor substrate further than the body contact region in each of the inactive sections.

17. The narrow active cell IE type trench gate IGBT according to claim 1, wherein an area of the buried electrode coupling part which is coupled to the emitter electrode is less than an area defined by the intra-trench electrode.

18. The narrow active cell IE type trench gate IGBT according to claim 1, wherein a length of the body contact region in the longitudinal direction between the active sections in each of the linear active cell regions is greater than a length of the intra-trench electrode in the longitudinal direction in each of the linear hole collector regions.

19. The narrow active cell IE type trench gate IGBT according to claim 1, wherein the first trenches of the intra-trench electrode intersect the second trenches of the intra-trench electrode in each of the linear hole collector regions.

20. The narrow active cell IE type trench gate IGBT according to claim 1, wherein the buried electrode coupling part is coupled to the first trenches of the intra-trench electrode and the second trenches of the intra-trench electrode.

* * * * *